(12) United States Patent
Matsumoto

(10) Patent No.: US 11,183,366 B2
(45) Date of Patent: Nov. 23, 2021

(54) MULTI-BEAM WRITING METHOD AND MULTI-BEAM WRITING APPARATUS

(71) Applicant: NuFlare Technology, Inc., Yokohama (JP)

(72) Inventor: Hiroshi Matsumoto, Yokohama (JP)

(73) Assignee: NuFlare Technology, Inc., Yokohama (JP)

( * ) Notice: Subject to any disclaimer, the term of this patent is extended or adjusted under 35 U.S.C. 154(b) by 0 days.

(21) Appl. No.: 16/913,074

(22) Filed: Jun. 26, 2020

(65) Prior Publication Data

US 2021/0013002 A1  Jan. 14, 2021

(30) Foreign Application Priority Data

Jul. 10, 2019  (JP) .............................. JP2019-128585

(51) Int. Cl.
*H01J 37/317* (2006.01)
*H01J 37/147* (2006.01)

(52) U.S. Cl.
CPC ...... *H01J 37/3177* (2013.01); *H01J 37/1471* (2013.01); *H01J 2237/0437* (2013.01)

(58) Field of Classification Search
CPC .............. H01J 37/3177; H01J 37/1471; H01J 2237/0437
See application file for complete search history.

(56) References Cited

U.S. PATENT DOCUMENTS

| | | | | |
|---|---|---|---|---|
| 5,260,579 A | * | 11/1993 | Yasuda | B82Y 10/00 250/492.2 |
| 7,777,201 B2 | | 8/2010 | Fragner et al. | |
| 8,492,732 B2 | * | 7/2013 | Ogasawara | B82Y 10/00 250/396 R |
| 9,275,824 B2 | * | 3/2016 | Matsumoto | H01J 37/1472 |
| 9,947,509 B2 | * | 4/2018 | Matsumoto | H01J 37/304 |

(Continued)

FOREIGN PATENT DOCUMENTS

| | | |
|---|---|---|
| JP | 2014-239178 A | 12/2014 |
| JP | 2017-73461 A | 4/2017 |
| JP | 6215586 B2 | 10/2017 |

OTHER PUBLICATIONS

Combined Taiwanese Office Action and Search Report dated Apr. 15, 2021 in Patent Application No. 109119263 (with English machine translation), citing document AA therein, 9 pages.

*Primary Examiner* — Sean M Luck
(74) *Attorney, Agent, or Firm* — Oblon, McClelland, Maier & Neustadt, L.L.P.

(57) ABSTRACT

A multi-beam writing method includes performing the k-th tracking control (k being a natural number) by beam deflection in order to follow movement of the stage while collecting each beam of multiple beams, performing a plurality of shots of the multiple beams by the each beam simultaneously shifting in a rectangular or square irradiation region, which is surrounded by the size of the beam pitch and corresponding to the each beam, while performing the k-th tracking control, and returning, after the period of the k-th tracking control has passed, the tracking position to a position which is obtained by adding an offset of an integer multiple of the size of the beam pitch to the tracking starting position of the k-th tracking control where the k-th tracking control started, to be as a starting position of the (k+1)th tracking control.

11 Claims, 23 Drawing Sheets

(56) References Cited

U.S. PATENT DOCUMENTS

| | | | |
|---|---|---|---|
| 2012/0286170 A1 | 11/2012 | Van De Peut et al. | |
| 2014/0361193 A1 | 12/2014 | Matsumoto | |
| 2016/0126062 A1* | 5/2016 | Muraki | H01J 37/3026 |
| | | | 250/492.3 |
| 2016/0155608 A1* | 6/2016 | Inoue | H01J 37/3045 |
| | | | 250/397 |
| 2017/0103869 A1 | 4/2017 | Matsumoto | |
| 2018/0261421 A1 | 9/2018 | Matsumoto et al. | |
| 2019/0066975 A1* | 2/2019 | Matsumoto | H01J 37/3177 |
| 2019/0198294 A1* | 6/2019 | Inoue | H01J 37/3026 |
| 2019/0304748 A1* | 10/2019 | Yoshikawa | H01J 37/3177 |

\* cited by examiner

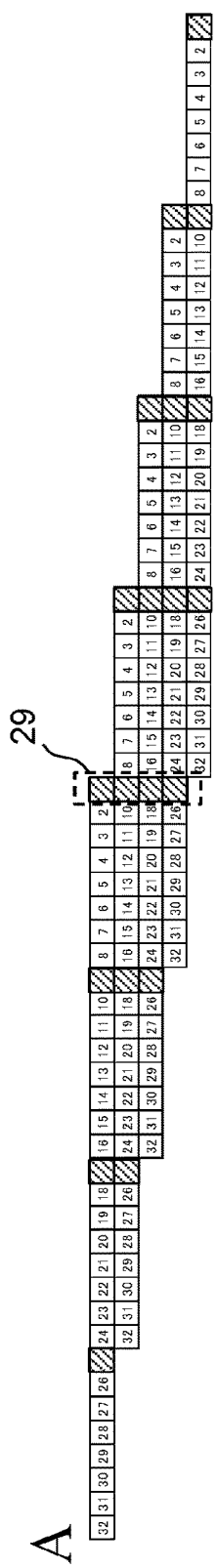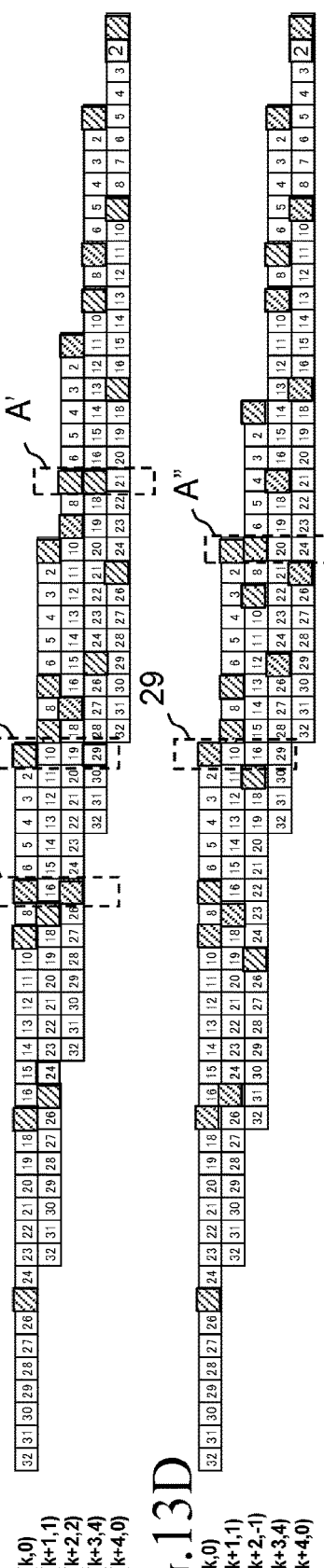
FIG.13A
FIG.13B
FIG.13C
FIG.13D

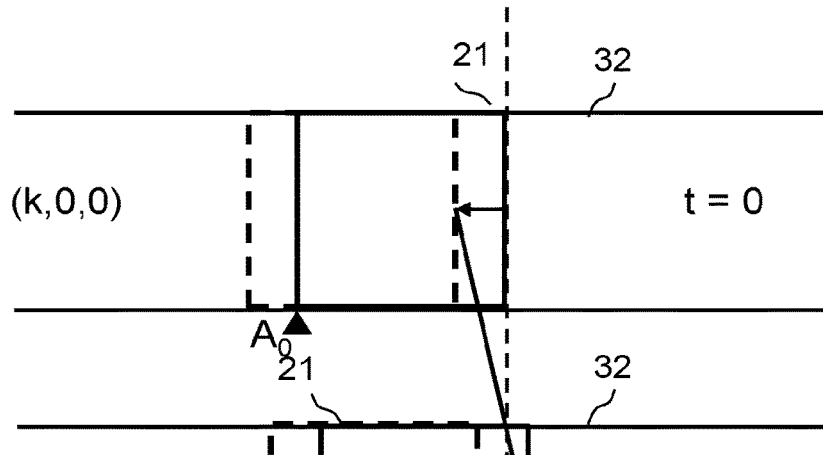
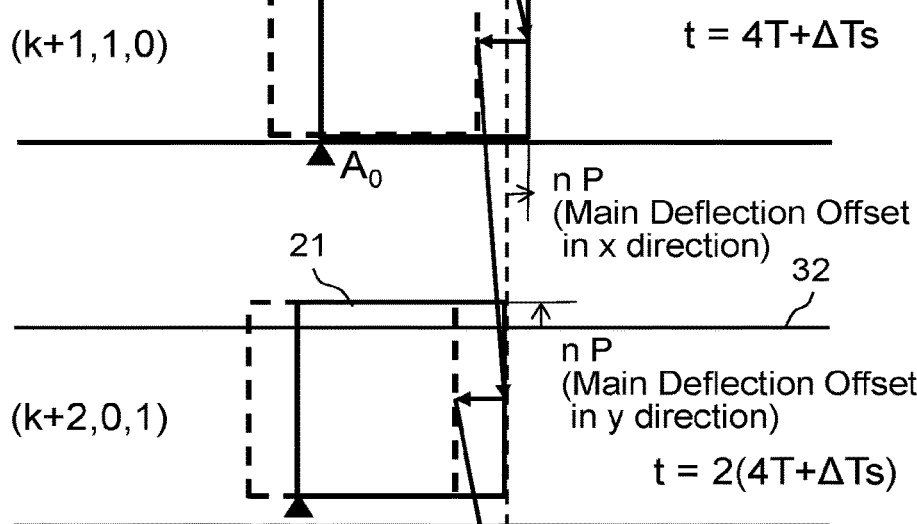
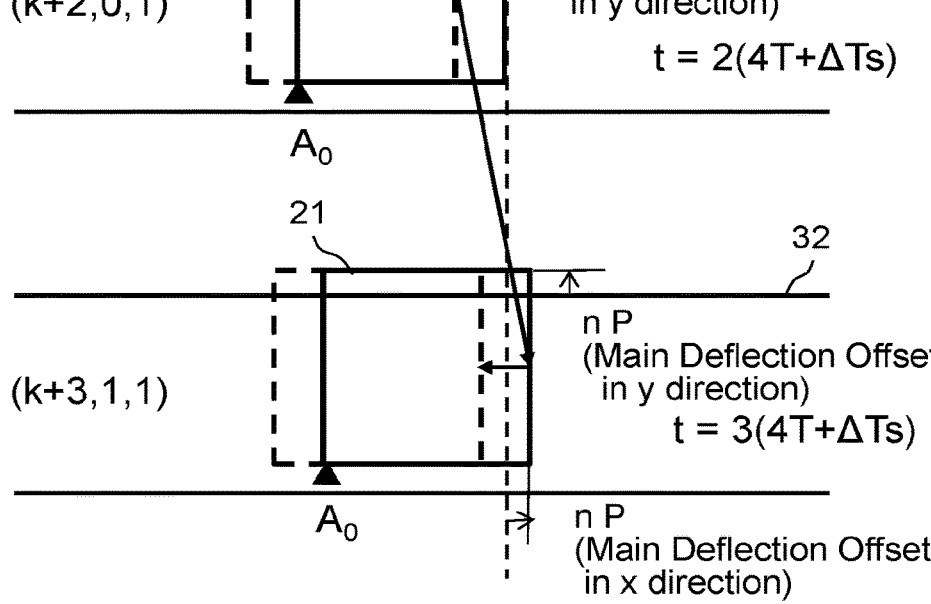
FIG.14A (k,0,0)　t = 0
FIG.14B (k+1,1,0)　t = 4T+ΔTs
FIG.14C (k+2,0,1)　t = 2(4T+ΔTs)
FIG.14D (k+3,1,1)　t = 3(4T+ΔTs)

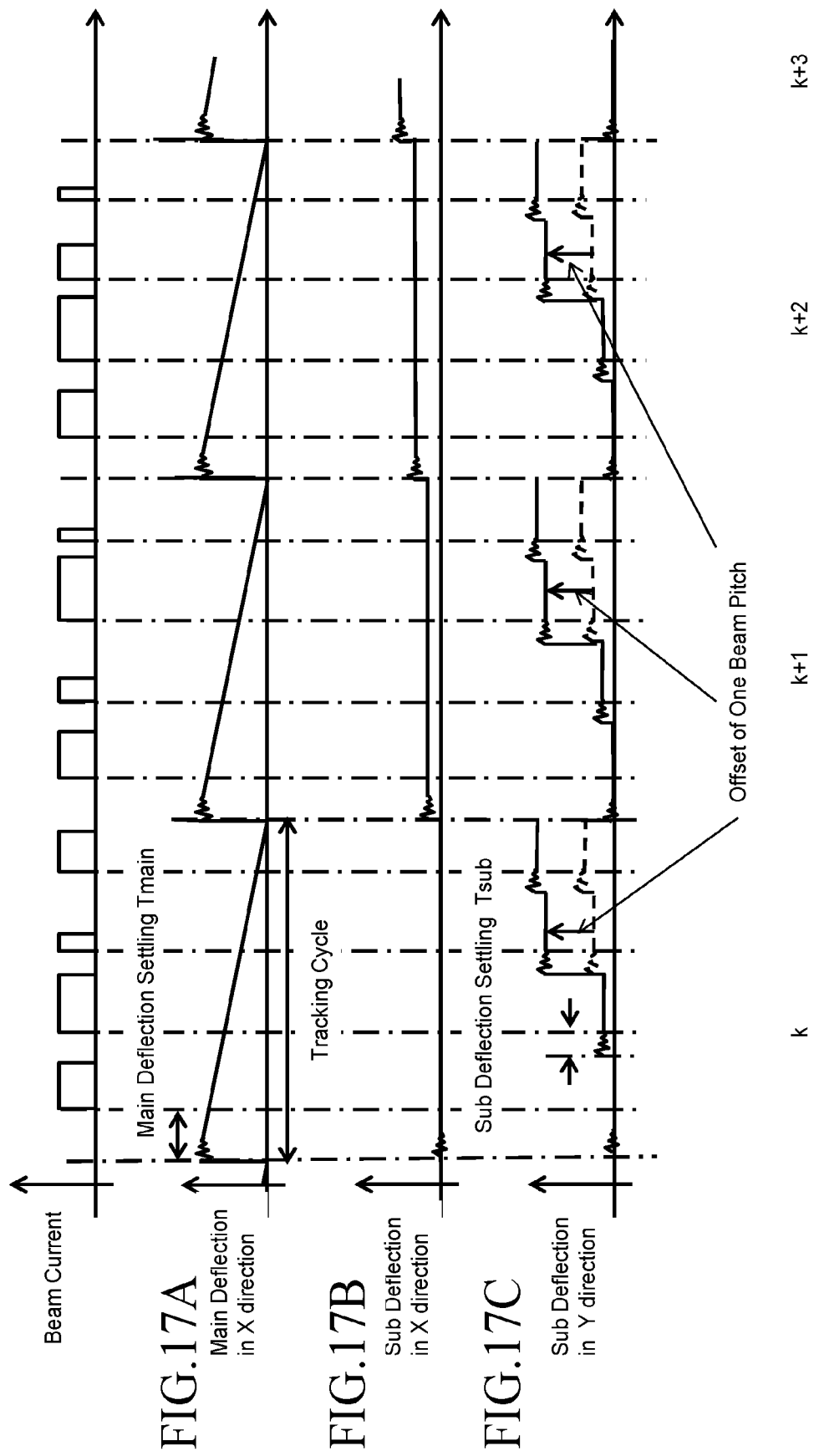

MULTI-BEAM WRITING METHOD AND MULTI-BEAM WRITING APPARATUS

CROSS-REFERENCE TO RELATED APPLICATION

This application is based upon and claims the benefit of priority from prior Japanese Patent Application No. 2019-128585 filed on Jul. 10, 2019 in Japan, the entire contents of which are incorporated herein by reference.

BACKGROUND OF THE INVENTION

Field of the Invention

Embodiments of the present invention relate to a multi-beam writing method and a multi-beam writing apparatus, and, for example, to a method for reducing image degradation due to a defective beam in multi-beam writing.

Description of Related Art

In recent years, with high integration of LSI, the line width (critical dimension) of semiconductor device circuits is decreasing year by year. An electron beam (EB) writing technique which has excellent resolution is used as a method of producing an exposure mask (also referred to as a reticle) for forming a circuit pattern on such semiconductor devices.

For example, as a known example of employing the electron beam writing technique, there is a writing apparatus using multiple beams. Since it is possible for multi-beam writing to apply multiple beams at a time (one shot), the writing throughput can be greatly increased in comparison with single electron beam writing. For example, a writing apparatus employing a multi-beam system forms multiple beams by letting portions of an electron beam emitted from an electron gun individually pass through a corresponding one of a plurality of holes in a mask, performs blanking control for each beam, reduces each unblocked beam by an optical system, and deflects it by a deflector to irradiate a desired position on a target object or "sample".

Conventionally, pixels are defined by dividing a writing region in the surface of a target object into a plurality of mesh regions by the beam size. Then, during irradiation with multiple beams of each shot to the target object placed on the stage moving at a fixed speed, each beam is applied to a plurality of pixels while each beam performs a tracking operation following a stage movement so that a pixel to be irradiated by each beam may not be deviated by the stage movement (e.g., refer to Japanese Patent Application Laid-open (JP-A) No. 2017-073461). After one tracking control is completed, the tracking operation is reset to swing back (return) each beam, and the deflection position is shifted to a next pixel adjacent to the pixel having been irradiated. Then, in the same way, each beam irradiation is performed while executing the tracking operation.

In multiple beams, a plurality of defective beams with uncontrollable irradiation time may be intermingled. When performing writing processing using such multiple beams, there is a problem, for example, that if a beam swing back amount (distance) in resetting the tracking operation and a distance between beams of a plurality of defective beams are equivalent (consistent) to each other, adjacent pixel columns are irradiated with a plurality of such defective beams. Furthermore, when a plurality of defective beams occur at a predetermined cycle, if a value of an integer multiple of the occurrence (generation) cycle of a plurality of defective beams and a beam swing back amount are equivalent (consistent) to each other, many pixels in the same small region surrounded by the beam pitch (pitch between beams) are irradiated with a plurality of defective beams. In such a case, the accuracy of a pattern written in the small region degrades. Therefore, when a plurality of defective beams occur in multiple beams, it is needed to reduce the number of pixels irradiated with defective beams in each small region.

BRIEF SUMMARY OF THE INVENTION

According to one aspect of the present invention, a multi-beam writing method includes performing a k-th tracking control (k being a natural number) by beam deflection in order to follow movement of a stage while collecting each beam of multiple beams, performing a plurality of shots of the multiple beams by the each beam simultaneously shifting in a rectangular or square irradiation region, which is surrounded by a size of a beam pitch and corresponding to the each beam, while performing the k-th tracking control, and returning, after a period of the k-th tracking control has passed, a tracking position to a position which is obtained by adding an offset of an integer multiple of the size of the beam pitch to a tracking starting position of the k-th tracking control where the k-th tracking control started, to be as a starting position of a (k+1)th tracking control.

According to another aspect of the present invention, a multi-beam writing method includes performing a tracking control by beam deflection using a deflector in order to follow movement of a stage while collecting each beam of multiple beams, performing a plurality of shots of the multiple beams by the each beam simultaneously shifting in a rectangular or square irradiation region, which is surrounded by a size of a beam pitch and corresponding to the each beam, while performing the tracking control, and collectively deflecting, during the tracking control, the multiple beams to a position to which a writing position of the each beam is offset by an offset distance of an integer multiple of the size of the beam pitch, using another deflector different from the deflector used for beam deflection for the tracking control.

According to yet another aspect of the present invention, a multi-beam writing apparatus includes a stage configured to mount a target object thereon and be able to move continuously, a multi-beam emission source configured to emit multiple beams, an irradiation time control circuit configured to control an irradiation time of each beam of the multiple beams, a first deflector configured to deflect the multiple beams to perform a k-th tracking control (k being a natural number) in order to follow movement of the stage while collecting the each beam of the multiple beams, a second deflector configured to deflect the multiple beams to perform a plurality of shots of the multiple beams by the each beam simultaneously shifting in a rectangular or square irradiation region, which is surrounded by a size of a beam pitch and corresponding to the each beam, during a tracking control period of each tracking control, and a deflection control circuit configured to control the first deflector, after a period of the k-th tracking control has passed, to return a tracking position to a position which is obtained by adding an offset of an integer multiple of the size of the beam pitch to a tracking starting position of the k-th tracking control where the k-th tracking control started, to be as a starting position of a (k+1)th tracking control.

BRIEF DESCRIPTION OF THE DRAWINGS

FIGS. 13A to 13D illustrate examples of a plurality of writing sequences in the case of an offset distance being variable according to the first embodiment;

FIGS. 14A to 14D illustrate tracking control according to a second embodiment;

FIGS. 17A to 17C show examples of a relation between deflection voltage and time according to the third embodiment;

DETAILED DESCRIPTION OF THE INVENTION

Embodiments below describe a method and apparatus that can reduce the number of pixels irradiated with a defective beam in each small region when a beam swing back amount (distance) in resetting the tracking operation and a distance between beams of a plurality of defective beams are equivalent (consistent) to each other.

Embodiments below describe a configuration in which an electron beam is used as an example of a charged particle beam. The charged particle beam is not limited to the electron beam, and other charged particle beam such as an ion beam may also be used. Moreover, not only a charged particle beam but also a laser beam and the like can be applied as multiple beams.

First Embodiment

Figure 1:
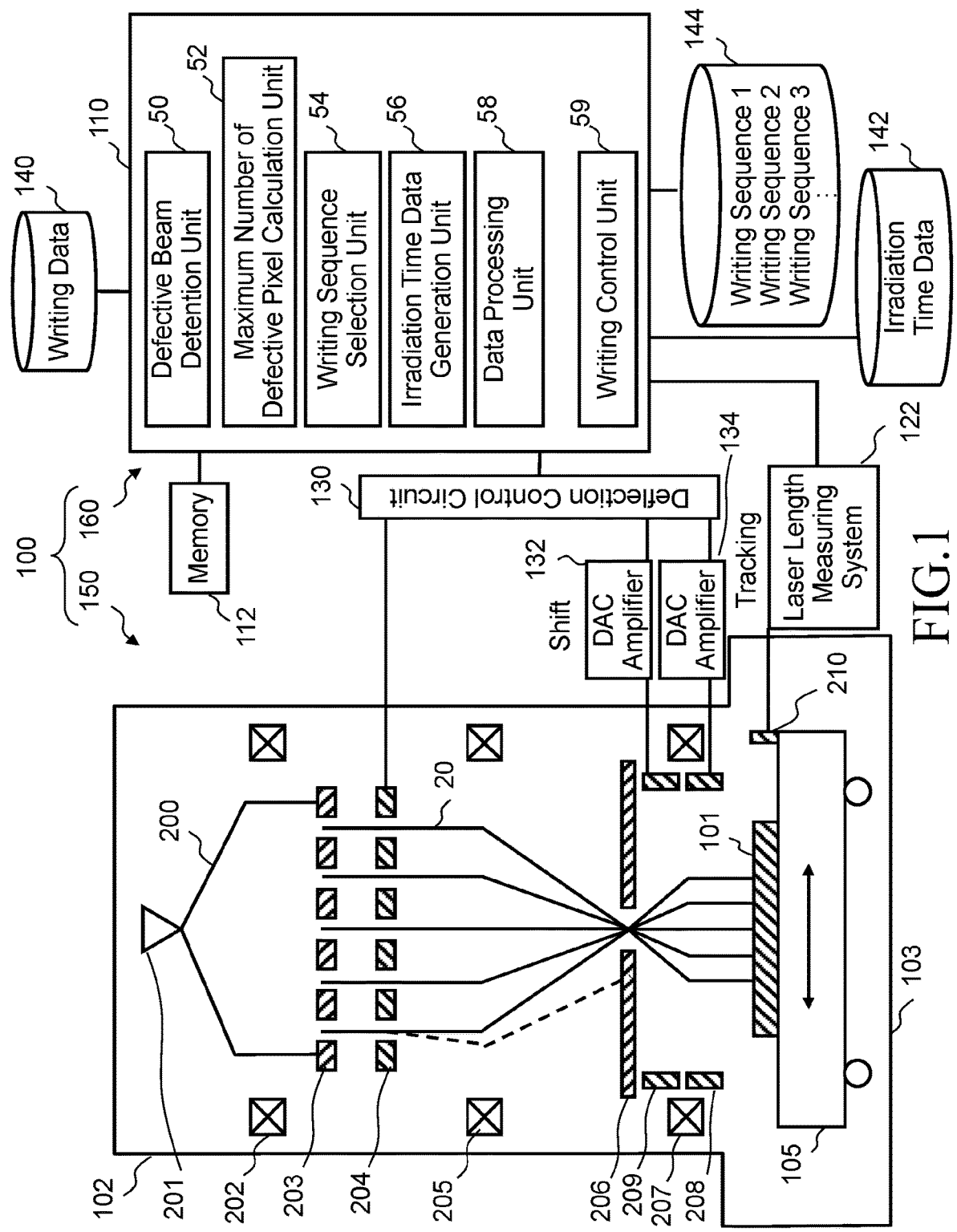
FIG. 1 is a schematic diagram showing a configuration of a writing apparatus according to a first embodiment.

FIG. 1 is a schematic diagram showing a configuration of a writing or "drawing" apparatus according to a first embodiment. As shown in FIG. 1, a writing apparatus 100 includes a writing mechanism 150 (multi-beam irradiation mechanism) and a control system circuit 160. The writing apparatus 100 is an example of a multi-charged particle beam writing apparatus. The writing mechanism 150 includes an electron beam column (electron optical column) 102 and a writing chamber 103. In the electron beam column 102, there are disposed an electron gun 201, an illumination lens 202, a shaping aperture array substrate 203, a blanking aperture array mechanism 204, a reducing lens 205, a limiting aperture substrate 206, an objective lens 207, a main deflector 208 (first deflector) and a sub deflector 209 (second deflector). In the writing chamber 103, an XY stage 105 is disposed. On the XY stage 105, a target object or "sample" 101 such as a mask serving as a writing target substrate is placed when writing (exposure) is performed. The target object 101 is, for example, an exposure mask used when fabricating semiconductor devices, or a semiconductor substrate (silicon wafer) for fabricating semiconductor devices. Moreover, the target object 101 may be, for example, a mask blank on which resist has been applied and nothing has yet been written. Further, on the XY stage 105, a mirror 210 for measuring the position of the XY stage 105 is placed. Electromagnetic lenses are used as the illumination lens 202, the reducing lens 205, and the objective lens 207. Each electromagnetic lens refracts multiple beams (electron beams).

The control system circuit 160 includes a control computer 110 which controls the whole of the writing apparatus 100, a memory 112, a deflection control circuit 130, DAC (digital-analog converter) amplifier units 132 and 134, a stage position detector 139, and storage devices 140, 142, and 144 such as magnetic disk drives. The control computer 110, the memory 112, the deflection control circuit 130, the stage position detector 139, and the storage devices 140, 142, and 144 such as magnetic disk drives are connected to each other through a bus (not shown). Writing data is input from the outside of the writing apparatus 100 into the storage device 140 (storage unit) and stored therein. A plurality of writing sequence data to be described later is input from the outside of the writing apparatus 100 into the storage device 144 (storage unit) and stored therein. The deflection control circuit 130 is connected to the DAC amplifiers (unit) 132 and 134, and the blanking aperture array mechanism 204 through a bus (not shown). Based on the principle of laser interferometry, a laser length measuring system 122 measures the position of the XY stage 105 by receiving a reflected light from the mirror 210 on the XY stage 105. The main deflector 208 is composed of at least four electrodes (or "at least four poles"), and controlled by the deflection control circuit 130 through the DAC amplifier 134 disposed for each electrode. Similarly, the sub deflector 209 is composed of at least four electrodes (or "at least four poles"), and controlled by the deflection control circuit 130 through the DAC amplifier 132 disposed for each electrode.

In the control computer 110, there are arranged a defective beam detection unit 50, a maximum number of defective pixels calculation unit 52, a writing sequence selection unit 54, an irradiation time data generation unit 56, a data processing unit 58, and a writing control unit 59. Each of the " . . . units" such as the defective beam detection unit 50, the maximum number of defective pixels calculation unit 52, the writing sequence selection unit 54, the irradiation time data generation unit 56, the data processing unit 58, and the writing control unit 59 includes processing circuitry. In the processing circuitry, for example, an electric circuit, computer, processor, circuit board, quantum circuit, or semiconductor device is included. Each " . . . unit" may use common processing circuitry (the same processing circuitry), or different processing circuitry (separate processing circuitry). Information input/output to/from the defective beam detection unit 50, the maximum number of defective pixels calculation unit 52, the writing sequence selection unit 54, the irradiation time data generation unit 56, the data processing unit 58, and the writing control unit 59, and information being operated are stored in the memory 112 each time.

FIG. 1 shows a configuration necessary for describing the first embodiment. Other configuration elements generally necessary for the writing apparatus 100 may also be included therein.

Figure 2:
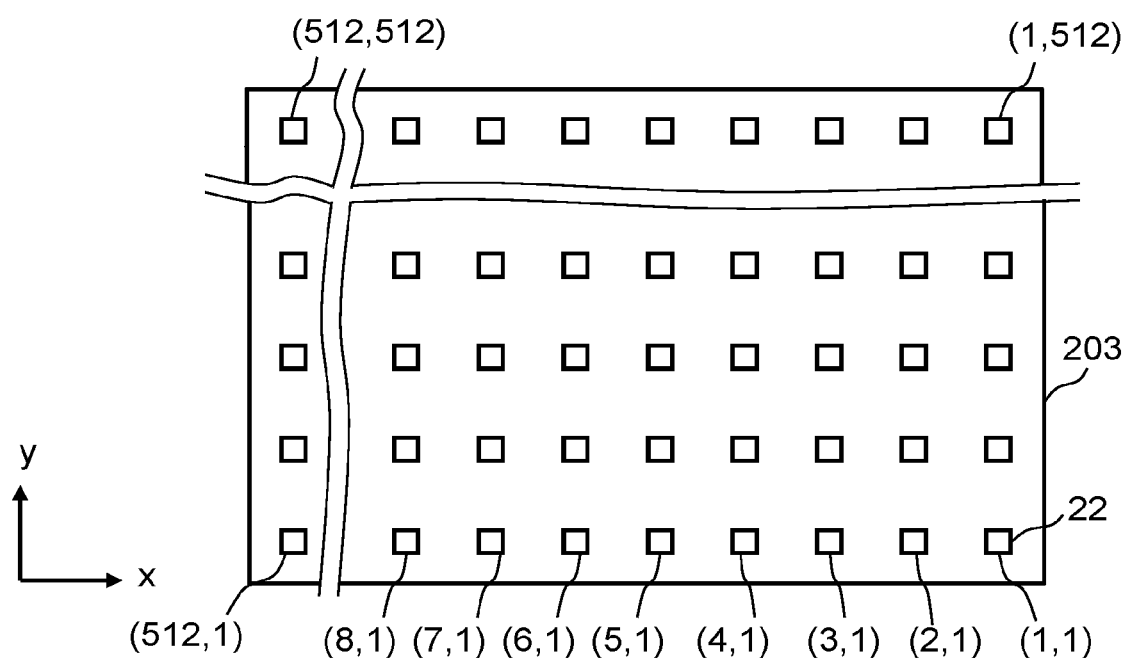
FIG. 2 is a conceptual diagram showing a configuration of a shaping aperture array substrate according to the first embodiment.

FIG. 2 is a conceptual diagram showing a configuration of a shaping aperture array substrate according to the first embodiment. As shown in FIG. 2, holes (openings) 22 of p rows long (length in the y direction) and q columns wide (width in the x direction) (p≥2, q≥2) are formed, like a matrix, at a predetermined arrangement pitch in the shaping aperture array substrate 203. In the case of FIG. 2, for example, holes (openings) 22 of 512×512, that is 512 (rows of holes arrayed in the y direction)×512 (columns of holes arrayed in the x direction), are formed. Each of the holes 22 is a rectangle (including a square) having the same dimension and shape. Alternatively, each of the holes 22 may be a circle with the same diameter.

To the electron gun 201, there is connected a high voltage power supply circuit (not shown). The high voltage power supply circuit applies an acceleration voltage to between a filament (cathode) and an extraction electrode (anode) (which are not shown) in the electron gun 201. In addition to the applying the acceleration voltage, applying a predetermined voltage to another extraction electrode (Wehnelt) and heating the cathode to a predetermined temperature are performed, and thereby, electrons from the cathode are accelerated to be emitted as an electron beam 200. Multiple beams 20 are formed by letting portions of the electron beam 200 individually pass through a corresponding one of a plurality of holes 22 in the shaping aperture array substrate 203.

In the blanking aperture array mechanism 204, a semiconductor substrate made of silicon, etc., for example, is disposed. The central part of the semiconductor substrate is shaved from the back side, for example, and made into a membrane region having a thin film thickness. In the membrane region, a passage hole (opening) for passage of each of multiple beams is formed at the position corresponding to the position of each hole 22 in the shaping aperture array substrate 203 shown in FIG. 2. In other words, a plurality of passage holes through each of which a corresponding one of electron multiple beams passes are formed in an array in the membrane region. Then, a pair of electrodes, that is a control electrode and a counter electrode (blanker: blanking deflector), is arranged at the opposite sides across each of a plurality of passage holes in the membrane region of the semiconductor substrate. Moreover, close to each passage hole in the semiconductor substrate, there is arranged a logic circuit which applies a deflection voltage to the control electrode for each passage hole. The counter electrode for each beam is grounded. n bit (e.g., ten bit) parallel lines for control signals are connected to the logic circuit for each beam. An individual blanking mechanism composed of the control electrode, the counter electrode, and the control circuit is configured for each beam of multiple beams.

Figure 3:
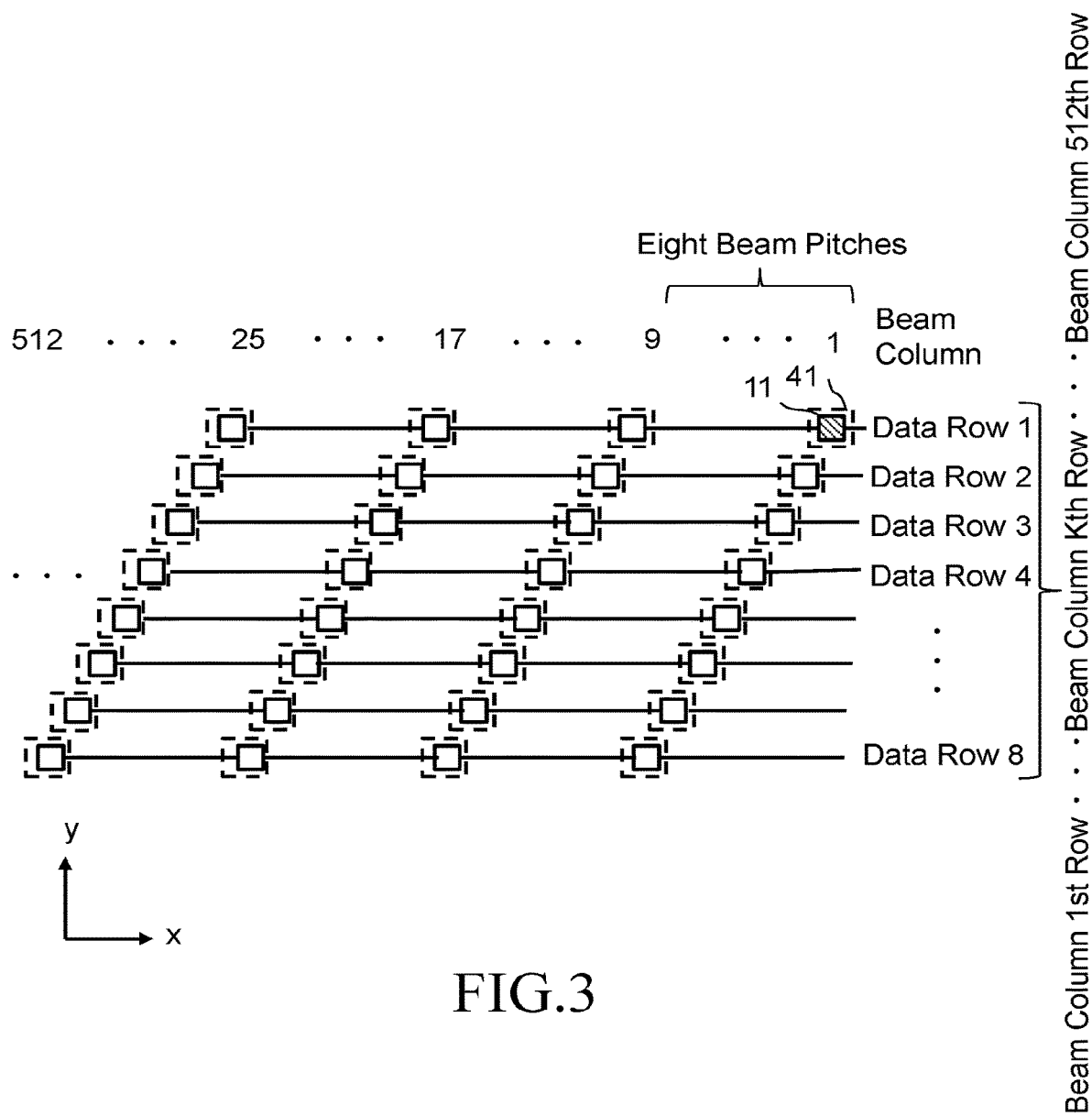
FIG. 3 shows an example of a grouped (connected) configuration of shift registers according to the first embodiment.

FIG. 3 shows an example of a grouped (connected) configuration of shift registers according to the first embodiment. A logic circuit 41 for each beam is formed in an array in a membrane region. For example, a plurality of logic circuits 41 (arranged in the x direction) in the same row are grouped. Then, the logic circuits 41 in the same group are further grouped into a plurality of subgroups as shown in FIG. 3. In the case of FIG. 3, each of the logic circuits 41 in each row is distributed in order into eight subgroups, for example. In the case of multiple beams of, for example, 512 rows×512 columns, the logic circuits 41 for the 1st to 512th beams in each row are subgrouped. Specifically, the logic circuits 41 for the 1st, 9th, 17th, 25th beams and so on at every eighth beam pitch in the 1st to 512th beams configure a data row 1 (subgroup). Similarly, the logic circuits 41 for the 2nd, 10th, 18th, 26th beams and so on at every eighth beam pitch configure a data row 2 (subgroup). In this way, a data row 3 (subgroup) to a data row 8 (subgroup) are configured. Then, the logic circuits 41 in each subgroup are connected in series. A signal for each group is divided and transmitted to each subgroup in parallel from the I/O circuit (not shown). A signal for each subgroup is transmitted to the logic circuits 41 connected in series in the subgroup concerned. Specifically, a shift register 11 is disposed in each logic circuit 41, and shift registers 11 in the logic circuits 41 in the same subgroup are connected in series. In the example of FIG. 3, sixty-four shift registers 11 are connected in series in each data row (subgroup). Therefore, irradiation time data for each beam is transmitted to the shift register 11 for each beam, by clock signals of sixty-four times. Although the case of forming one group for each the same row (x direction) is shown in FIG. 3, it is not limited thereto. For example, it is also preferable to divide a row into a left half and a right half, and to form one group composed of the logic circuits 41 for the beams of the left half in the same row, and another group composed of the logic circuits 41 for the beams of the right half in the same row. Thereby, thirty-two shift registers 11 are connected in series in each data row (subgroup). Alternatively, a plurality of logic circuits 41 (arranged in the y direction) in the same column may be grouped.

Each of the multiple beams 20 passing through a corresponding one of a plurality of passage holes in the blanking aperture array mechanism 204 is deflected by the voltage independently applied to the two electrodes being a pair. Blanking control is provided by this deflection. Thus, when the multiple beams 20 pass through the blanking aperture array mechanism 204, a plurality of blankers respectively perform blanking deflection of a corresponding beam of the multiple beams having passed through a plurality of holes 22 (openings) in the shaping aperture array substrate 203.

Next, operations of the writing mechanism 150 will be described. The electron beam 200 emitted from the electron gun 201 (multi-beam emission source) almost perpendicularly (e.g., vertically) illuminates the whole of the shaping aperture array substrate 203 by the illumination lens 202. A plurality of rectangular (including square, etc.) holes 22 (openings) are formed in the shaping aperture array substrate 203. The region including all the plurality of holes 22 is irradiated with the electron beam 200. For example, rectangular (including square) multiple beams (a plurality of electron beams) 20 are formed by letting portions of the electron beam 200, which irradiates the positions of a plurality of holes 22, individually pass through a corresponding one of the plurality of holes 22 in the shaping aperture array substrate 203. The multiple beams 20 individually pass through corresponding blankers (first deflector: individual blanking mechanism 47) of the blanking aperture array mechanism 204. The blanker provides blanking control such that a corresponding electron beam of the multiple beams 20 individually passing through the blanker becomes in an ON condition during a writing time (irradiation time) having been set. In other words, the blanking aperture array mechanism 204 (an example of an irradiation time control circuit (unit)) controls the irradiation time of each of the multiple beams.

The multiple beams 20 having passed through the blanking aperture array mechanism 204 are reduced by the reducing lens 205, and go toward the hole in the center of the limiting aperture substrate 206. Then, the electron beam which was deflected by the blanker of the blanking aperture array mechanism 204 deviates (shifts) from the hole in the center of the limiting aperture substrate 206 (blanking aperture member), and is blocked by the limiting aperture substrate 206. On the other hand, the electron beam which was not deflected by the blanker of the blanking aperture array mechanism 204 passes through the hole in the center of the limiting aperture substrate 206 as shown in FIG. 1. Thus, the limiting aperture substrate 206 blocks each beam which was deflected to be in the OFF condition by the individual blanking mechanism. Then, for each beam, one shot beam is formed by a beam which has been made during a period from becoming beam ON to becoming beam OFF and has passed through the limiting aperture substrate 206. The multiple beams 20 having passed through the limiting aperture substrate 206 are focused by the objective lens 207 so as to be a pattern image of a desired reduction ratio. Then, all the multiple beams 20 having passed through the limiting aperture substrate 206 are collectively deflected in the same direction by the main deflector 208 and the sub deflector 209 to irradiate respective beam irradiation positions on the target object 101. Moreover, for example while the XY stage 105 is continuously moving, tracking control is performed by the main deflector 208 so that the beam irradiation position may follow the movement of the XY stage 105. Ideally, the multiple beams 20 irradiating at a time are aligned at the pitch obtained by multiplying the arrangement pitch of a plurality of holes 22 in the shaping aperture array substrate 203 by the desired reduction ratio described above.

Figure 4:
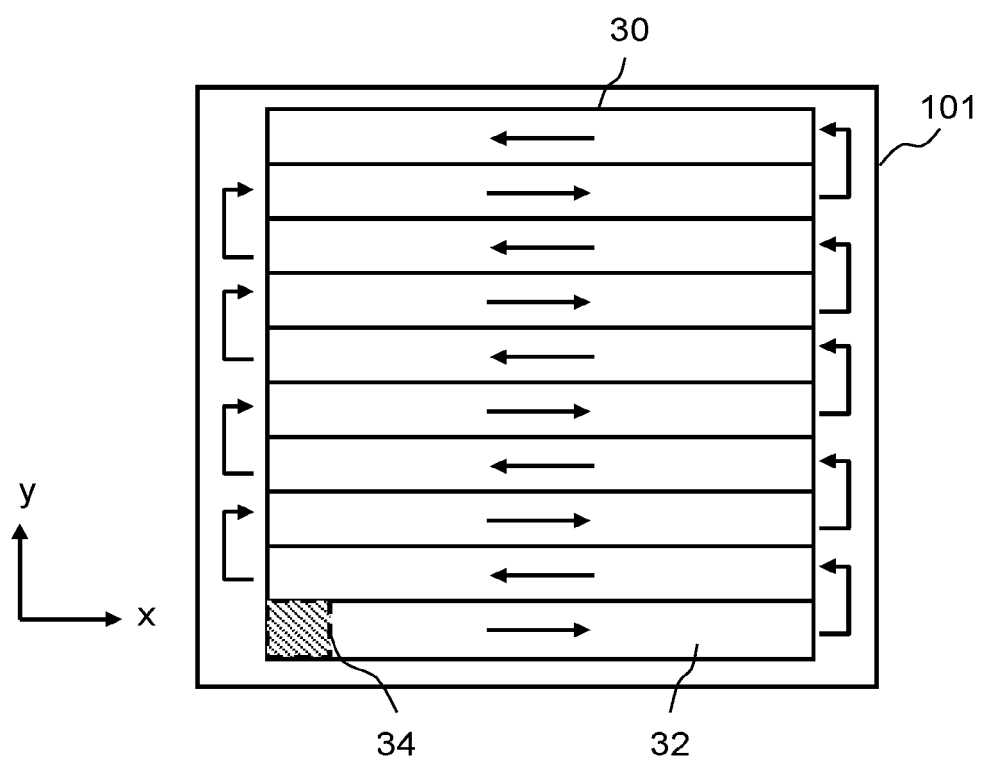
FIG. 4 is a conceptual diagram describing an example of a writing operation according to the first embodiment.

FIG. 4 is a conceptual diagram describing an example of a writing operation according to the first embodiment. As shown in FIG. 4, a writing region 30 of the target object 101 is virtually divided, by a predetermined width in the y direction, into a plurality of stripe regions 32 in a strip form, for example. First, the XY stage 105 is moved to make an adjustment such that an irradiation region 34 which can be irradiated with one shot of the multiple beams 20 is located at the left end of the first stripe region 32 or at a position further left than the left end, and then writing is started. When writing the first stripe region 32, the XY stage 105 is moved, for example, in the −x direction so that the writing may relatively proceed in the x direction. The XY stage 105 is moved, for example, continuously at a constant speed. After writing the first stripe region 32, the stage position is moved in the −y direction to make an adjustment such that the irradiation region 34 is located at the right end of the second stripe region 32 or at a position further right than the right end to be thus located relatively in the y direction. Then, by moving the XY stage 105 in the x direction, for example, writing proceeds in the −x direction. That is, writing is performed while alternately changing the direction, such as performing writing in the x direction in the third stripe region 32, and in the −x direction in the fourth stripe region 32, thereby reducing the writing time. However, the writing operation is not limited to the writing while alternately changing the direction, and it is also preferable to perform writing in the same direction when writing each stripe region 32. A plurality of shot patterns maximally up to as many as the number of the holes 22 are formed at a time by one shot of multiple beams having been formed by passing through the holes 22 in the shaping aperture array substrate 203.

The irradiation region 34 described above can be defined as a rectangular (including square) region whose x-direction dimension is a value obtained by multiplying the pitch P between beams in the x direction by the number of beams in the x direction, and y-direction dimension is a value obtained by multiplying the pitch P between beams in the y direction by the number of beams in the y direction. The beam pitch P in the x direction and the beam pitch P in the y direction may be the same value or different values. In the first embodiment, the beam pitch P in the x direction and the beam pitch P in the y direction are the same value.

Figure 5:
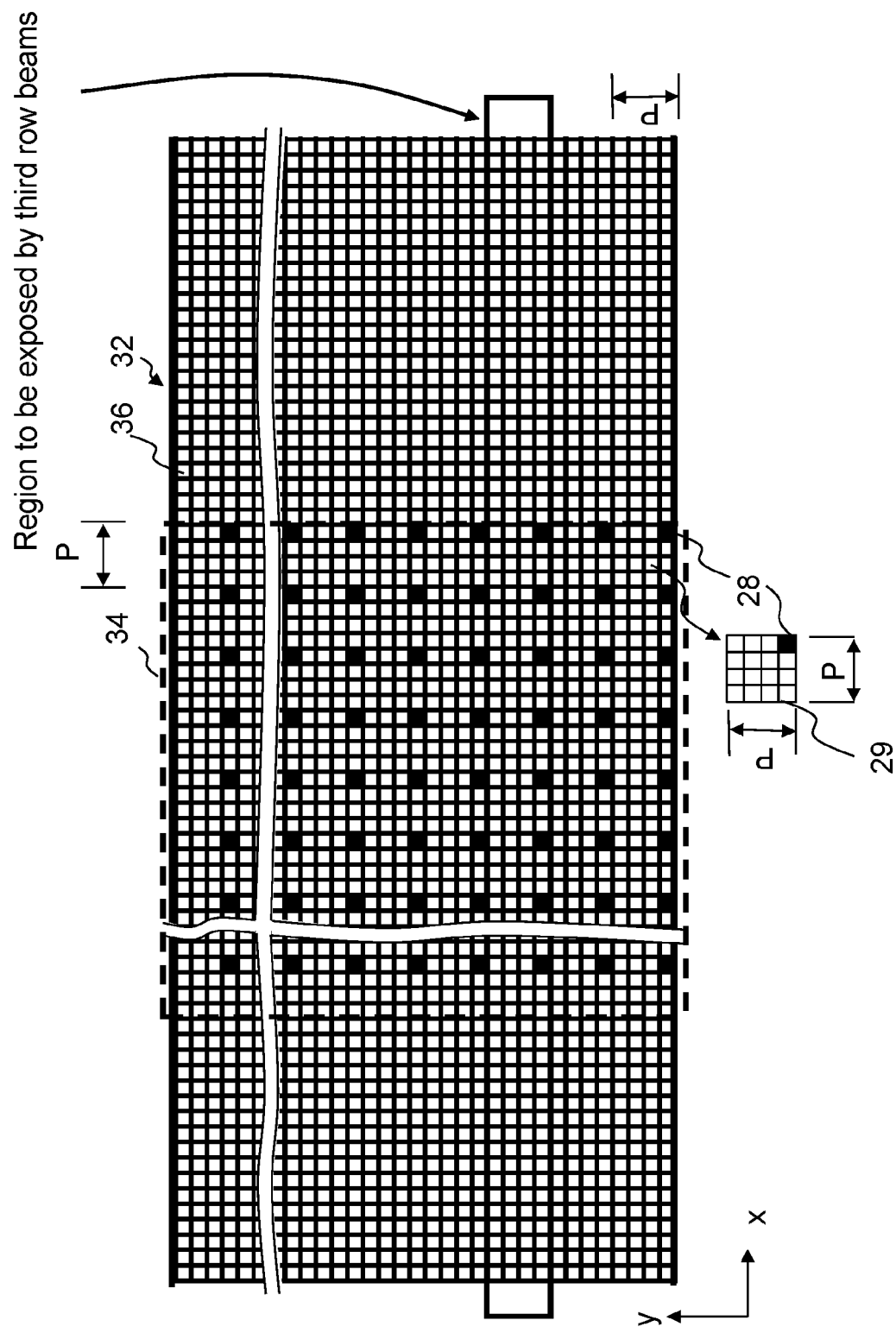
FIG. 5 shows an example of an irradiation region of multiple beams and a pixel to be written (writing target pixel) according to the first embodiment.

FIG. 5 shows an example of an irradiation region of multiple beams and a pixel to be written (writing target pixel) according to the first embodiment. In FIG. 5, the stripe region 32 is divided into a plurality of mesh regions by the beam size of each of the multiple beams, for example. Each mesh region serves as a writing pixel 36 (unit irradiation region, or writing position). The size of the writing pixel 36 is not limited to the beam size, and may be an arbitrary size regardless of the beam size. For example, it may be 1/n (n being an integer of 1 or more) of the beam size. FIG. 5 shows the case where the writing region of the target object 101 is divided, for example, in the y direction, into a plurality of stripe regions 32 by the width size being substantially the same as the size of the irradiation region 34 (writing field) which can be irradiated by one irradiation with the multiple beams 20. The width of the stripe region 32 is not limited to this. Preferably, the width of the stripe region 32 is n times (n being an integer of 1 or more) the size of the irradiation region 34. FIG. 5 shows the case of multiple beams of 512 (rows)×512 (columns). In the irradiation region 34, there are shown a plurality of pixels 28 (beam writing positions) which can be irradiated with one shot of the multiple beams 20. In other words, the pitch between adjacent pixels 28 is the pitch P between beams of the multiple beams. In the example of FIG. 5, one sub-irradiation region 29 is a square region surrounded by four adjacent pixels 28 at the four corners, and including therein just one of the four pixels 28. In the case of FIG. 5, each sub-irradiation region 29 is composed of 4×4 pixels including one pixel 28.

Figure 6:
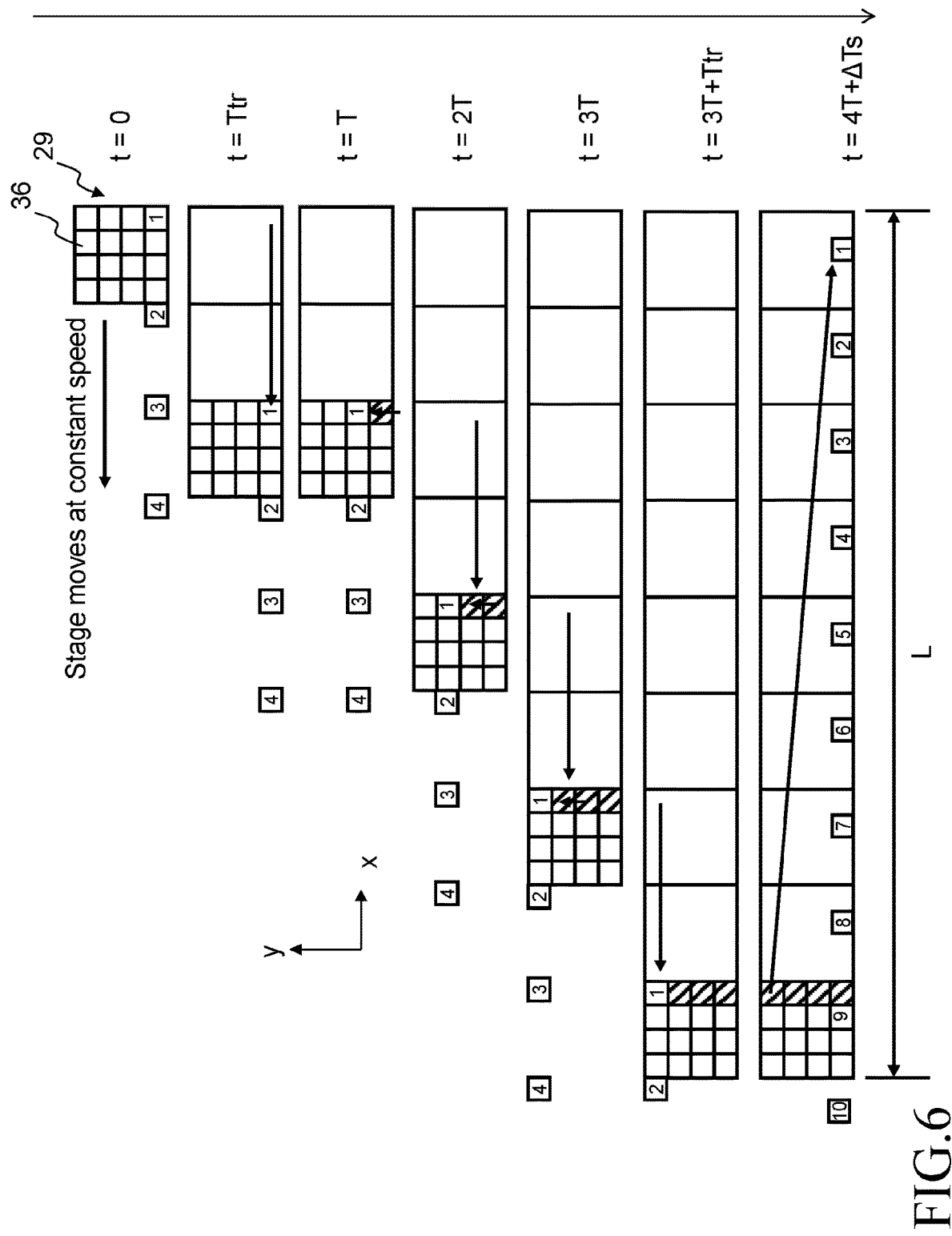
FIG. 6 illustrates an example of a writing sequence of multiple beams according to a comparative example of the first embodiment.

FIG. 6 illustrates an example of a writing sequence of multiple beams according to a comparative example of the first embodiment. FIG. 6 shows a portion of the sub-irradiation region 29 to be written by each of beams at the coordinates (1, 3), (2, 3), (3, 3), . . . , (512, 3) in the third row from the bottom in the multiple beams for writing the stripe region 32 shown in FIG. 5. In the example of FIG. 6, while the XY stage 105 moves the distance of eight beam pitches, four pixels are written (exposed), for example. In order that the relative position between the irradiation region 34 and the target object 101 may not shift by the movement of the XY stage 105 while these four pixels are written (exposed), the irradiation region 34 is made to follow the movement of the XY stage 105 by collective deflection of all the multiple beams 20 by the main deflector 208. In other words, tracking control is performed. In the case of FIG. 6, one tracking cycle is executed by writing (exposing) four pixels while moving the distance of eight beam pitches.

Specifically, the laser length measuring system 122 measures the position of the XY stage 105 by irradiating the mirror 210 with a laser and receiving a reflected light from the mirror 210. The measured position of the XY stage 105 is output to the control computer 110. In the control computer 110, the writing control unit 59 outputs the position information on the XY stage 105 to the deflection control circuit 130. The deflection control circuit 130 calculates deflection amount data (tracking deflection data) for deflecting beams in order to follow the movement of the XY stage 105 while being in accordance with its movement. The tracking deflection data being a digital signal is output to the DAC amplifier unit 134. The DAC amplifier unit 134 converts the digital signal to an analog signal and amplifies it to be applied as a tracking deflection voltage to the main deflector 208.

The writing mechanism 150 irradiates each pixel 36 with a corresponding one of ON beams of the multiple beams 20 during a writing time (irradiation time or exposure time) corresponding to the pixel 36 concerned within a maximum writing time Ttr of the irradiation time of each of the multiple beams in the shot concerned.

In the example of FIG. 6, the first pixel from the right in the bottom row of the sub-irradiation region 29 concerned is irradiated with a beam of the first shot using the beam (1) at coordinates (1, 3) during the time from t=0 which is after main deflection settling and sub deflection settling to t=maximum writing time Ttr. The XY stage 105 moves, for example, two beam pitches in the −x direction during the shot cycle time T which is obtained by adding a sub deflection settling time to the time from t=0 to t=maximum writing time Ttr. During this time period, the tracking operation is continuously performed.

After the maximum writing time Ttr of the shot concerned has elapsed since the start of beam irradiation with the shot concerned, while the beam deflection for tracking control is continuously performed by the main deflector 208, the writing position (previous writing position) of each beam is shifted to a next writing position (current writing position) of each beam by collective deflection of the multiple beams 20 by the sub deflector 209, which is performed in addition to the beam deflection for tracking control. In the example of FIG. 6, when the time becomes t=Ttr, shifting is started from the first pixel from the right in the bottom row of the sub-irradiation region 29 concerned to write a next writing target pixel. At the time of becoming t=T, the target pixel to be written is shifted from the first pixel from the right in the bottom row of the sub-irradiation region 29 concerned to the first pixel from the right in the second row from the bottom. Since the XY stage 105 is moving at a fixed constant speed also during this time period, the tracking operation is continuously performed.

Then, while the tracking control is continuously performed, each corresponding one of ON beams in the multiple beams 20 is applied to the shifted writing position corresponding to each beam during a writing time corresponding to each beam within the maximum writing time Ttr of the shot concerned. In the example of FIG. 6, the first pixel from the right in the second row from the bottom of the sub-irradiation region 29 concerned is irradiated with the second shot of the beam (1) at the coordinates (1, 3) during the time from t=T to t=T+Ttr. The XY stage 105 moves, for example, two beam pitches in the −x direction during the time from t=T to t=2T. During this time period, the tracking operation is continuously performed.

In the case of FIG. 6, when the time becomes t=T+Ttr, shifting is started from the first pixel from the right in the second row from the bottom of the sub-irradiation region 29 concerned to a next writing target pixel. At the time of becoming t=2T, the target pixel to be written is shifted from the first pixel from the right in the second row from the bottom of the sub-irradiation region 29 concerned to the first pixel from the right in the third row from the bottom by collective deflection of the multiple beams by the sub deflector 209. Since the XY stage 105 is moving also during this time period, the tracking operation is continuously performed. Then, the first pixel from the right in the third row from the bottom of the sub-irradiation region 29 concerned is irradiated with the third shot of the beam (1) at the coordinates (1, 3) during the time from t=2T to t=2T+Ttr, for example. The XY stage 105 moves, for example, two beam pitches in the −x direction during the time from t=2T to t=3T. During this time period, the tracking operation is continuously performed. When the time becomes t=2T+Ttr, shifting is started from the first pixel from the right in the third row from the bottom of the sub-irradiation region 29 concerned to write a next writing target pixel. At the time of becoming t=3T, the target pixel to be written is shifted from the first pixel from the right in the third row from the bottom of the sub-irradiation region 29 concerned to the first pixel from the right in the fourth row from the bottom by collective deflection of the multiple beams by the sub deflector 209. Since the XY stage 105 is moving also during this time period, the tracking operation is continuously performed. Then, the first pixel from the right in the fourth row from the bottom of the sub-irradiation region 29 concerned is irradiated with the fourth shot of the beam (1) at the coordinates (1, 3) during the time from t=3T to t=3T+Ttr, for example. The XY stage 105 moves, for example, two beam pitches in the −x direction during the time from t=3T to t=4T. During this time period, the tracking operation is continuously performed. In this manner, writing of the pixels in the first column from the right in the sub-irradiation region 29 concerned has been completed.

In the example of FIG. 6, after applying a corresponding beam to the writing position of each beam which has been shifted three times from the initial position, the DAC amplifier unit 134 returns the tracking position to the tracking start position where the tracking control was started, by resetting the beam deflection for tracking control. In other words, the tracking position is returned in the opposite direction to the direction of the stage movement. In the example of FIG. 6, when the time becomes t=3T+Ttr, tracking of the sub-irradiation region 29 concerned is cancelled, and the beam is swung back to a next target sub-irradiation region 29 shifted by eight beam pitches in the x direction. Although the beam (1) at the coordinates (1, 3) has been described in the example of FIG. 6, writing is also similarly performed for each sub-irradiation region 29 corresponding to a beam at other coordinates. That is, when the time becomes t=3T+Ttr, the beam at coordinates (n, m) completes writing of pixels in the first column from the right in a corresponding sub-irradiation region 29. For example, the beam (2) at coordinates (2, 3) of FIG. 6 completes writing of pixels in the first column from the right in the sub-irradiation region 29 adjacent in the −x direction to the sub-irradiation region 29 for the beam (1).

Since writing of the pixels in the first column from the right of each sub-irradiation region 29 has been completed, in a next tracking cycle after resetting the tracking, when the main deflection settling time period including the time t=4T has elapsed, that is the time (t=4T+ΔTs), the sub deflector 209 performs deflection such that the writing position of each corresponding beam is adjusted (shifted) to the second pixel from the right in the first row from the bottom of each sub-irradiation region 29. ΔTs is equivalent to the time obtained by subtracting a sub deflection settling time from a main deflection settling time, that is, (main deflection settling time)−(sub deflection settling time).

As described above, in the state where the relative position of the irradiation region 34 to the target object 101 is controlled by the main deflector 208 to be the same (unchanged) position during the same tracking cycle, each shot is carried out while performing shifting from one pixel to another pixel by the sub deflector 209. Then, after finishing one tracking cycle and returning the tracking position of the irradiation region 34, the first shot position is adjusted to the position shifted by, for example, one pixel as shown in the lower part of FIG. 6, and each shot is performed with shifting from one pixel to another pixel by the sub deflector 209 while executing a next tracking control. By repeating this operation during writing the stripe region 32, the position of the irradiation region 34 moves by a tracking distance in order, with being overlapped, to perform writing of the stripe region concerned.

In the multiple beams 20, a plurality of defective beams whose irradiation time is uncontrollable may be intermingled. Such a defective beam is, for example, an "always on" beam or "always off" beam, in addition to a beam which can be "on" but whose irradiation time cannot be controlled. When performing writing processing using the multiple beams 20 in which such defective beams are intermingled, there is a problem that, for example, if a beam swing back amount (distance) in resetting the tracking operation and a distance between beams of a plurality of defective beams are equivalent (consistent) to each other, adjacent pixel columns, for example, are irradiated with a plurality of such defective beams. Furthermore, when a plurality of defective beams occur at a predetermined cycle, if a value of an integer multiple of the occurrence (generation) cycle of a plurality of defective beams and a beam swing back amount are equivalent (consistent) to each other, many pixels in the same small region surrounded by the beam pitch are irradiated with a plurality of defective beams. As shown in FIG. 3, the shift registers 11 are connected in series in each subgroup. Therefore, when the shift register 11 for the beam 1 indicated by oblique lines is out of order, for example, irradiation time data for the beams 9, 17, 25, etc. on the downstream side differ from desired data. For example, when the shift register 11 for the beam 9 is out of order, although the irradiation time data for the beam 1 on the upstream side can be normally used, the irradiation time data for the beams 17, 25, etc. on the downstream side differ from desired data. Therefore, in the case of FIG. 3, for example, a plurality of defective beams having periodicity occur every eight beam pitches.

Figure 7:
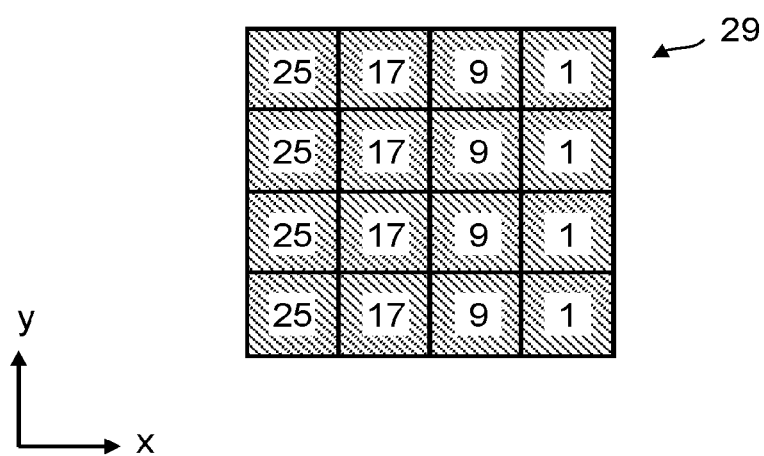
FIG. 7 illustrates an example of a writing situation of a sub irradiation region in the case of a beam swing back amount and an occurrence (generation) cycle of a plurality of defective beams being equivalent (consistent) to each other, according to a comparative example of the first embodiment.

FIG. 7 illustrates an example of a writing situation of a sub irradiation region in the case of a beam swing back amount and an occurrence (generation) cycle of a plurality of defective beams being equivalent (consistent) to each other, according to a comparative example of the first embodiment. In performing writing processing based on the writing sequence shown in FIG. 6, when the first pixel column from the right in the sub irradiation region 29 concerned is written by the beam 1, the second pixel column from the right is written by the beam 9. The third pixel column from the right is written by the beam 17. The fourth pixel column from the right is written by the beam 25. Thus, if the beam swing back amount and the occurrence (generation) cycle of a plurality of defective beams are equivalent (consistent) to each other, being eight beam pitches, all of the sixteen pixels in the sub irradiation region 29 concerned are written by the defective beams. In that case, the pattern written in the sub irradiation region 29 (small region) concerned cannot be used. Accordingly, even when a plurality of defective beams occur in the multiple beams 20, it is required to reduce the number of pixels irradiated with defective beams in each sub irradiation region 29 (small region). Then, according to the first embodiment, an offset of an integer multiple (nP) of a beam pitch is provided for beam deflection. It will be specifically described below.

Figure 8:
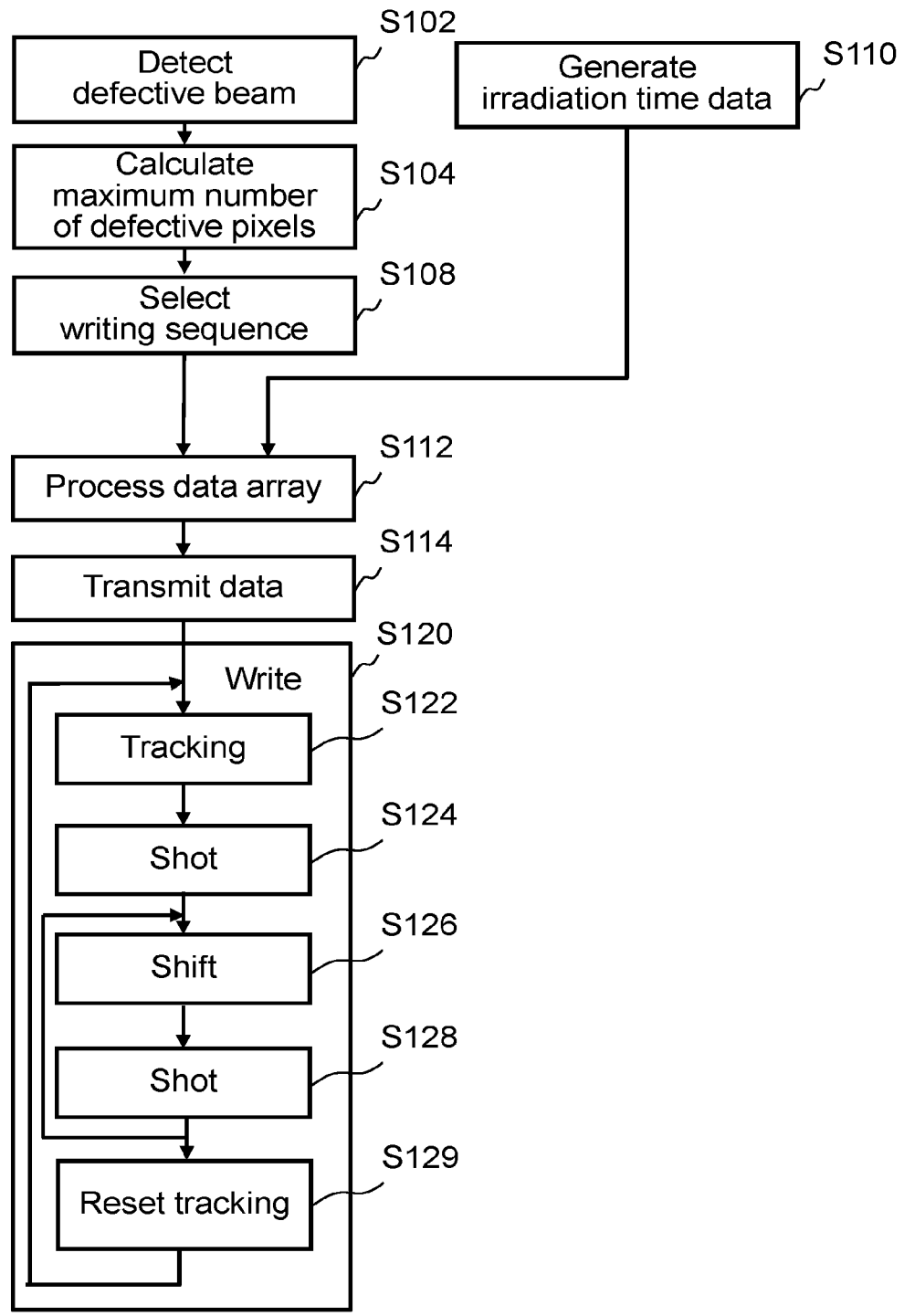
FIG. 8 is a flowchart showing main steps of a writing method according to the first embodiment.

FIG. 8 is a flowchart showing main steps of a writing method according to the first embodiment. In FIG. 8, the writing method of the first embodiment executes a series of steps: a defective beam detection step (S102), a maximum number of defective pixels calculation step (S104), a writing sequence selection step (S108), an irradiation time data generation step (S110), a data array processing step (S112), a data transmission step (S114), and a writing step (S120). In the writing step (S120), a series of steps of a tracking step (S122), a shot step (S124), a shift step (S126), a shot step (S128), and a tracking reset step (S129) are carried out.

In the defective beam detection step (S102), the defective beam detection unit 50 detects a defective beam in the multiple beams 20. For example, irradiation time data for evaluation is transmitted using the shift register 11 for each beam. Then, the value of each beam based on the data having passed through each shift register 11 is measured. Specifically, the current amount of each beam is measured by applying each of the multiple beams 20 one by one to a Faraday cup (not shown) by control of the writing control unit 59. The blanking aperture array mechanism 204 is operated such that the target beam becomes ON and other beams become OFF. For example, the operation of applying each beam one by one during each preset irradiation time period to the Faraday cup is repeated a plurality of times. The defective beam detection unit 50 inputs a total acquired current amount, and measures an average current amount obtained by dividing the total current amount by the repeating number. Then, if the measured average current amount is excess or short compared to the design value, the beam concerned can be detected as a defective beam. If an "always on" beam exists, when detecting each beam current, a beam current including that of the "always on" beam is detected. However, since the total current amount in the case of measuring only the current of the "always on" beam is smaller that of other beam, it is possible to identify the "always on" beam. When the "always on" beam can be identified, the total current amount of the beam concerned is known by subtracting the measurement result of the "always on" beam from the measurement result of other beam.

The detection method of a defective beam is not limited thereto. For example, it is also preferable to separately input information identifiably defining a defective beam in the multiple beams 20 from the outside of the writing apparatus 100, and to store it in the storage device 144. Alternatively, it is also preferable, without applying a beam, to transmit evaluation data to the logic circuit 41 of each beam, and collect the transmitted data to compare it with a design value. Then, if there is a difference between the transmitted data and the design value, it is determined that the beam concerned is a defective beam.

Figure 9:
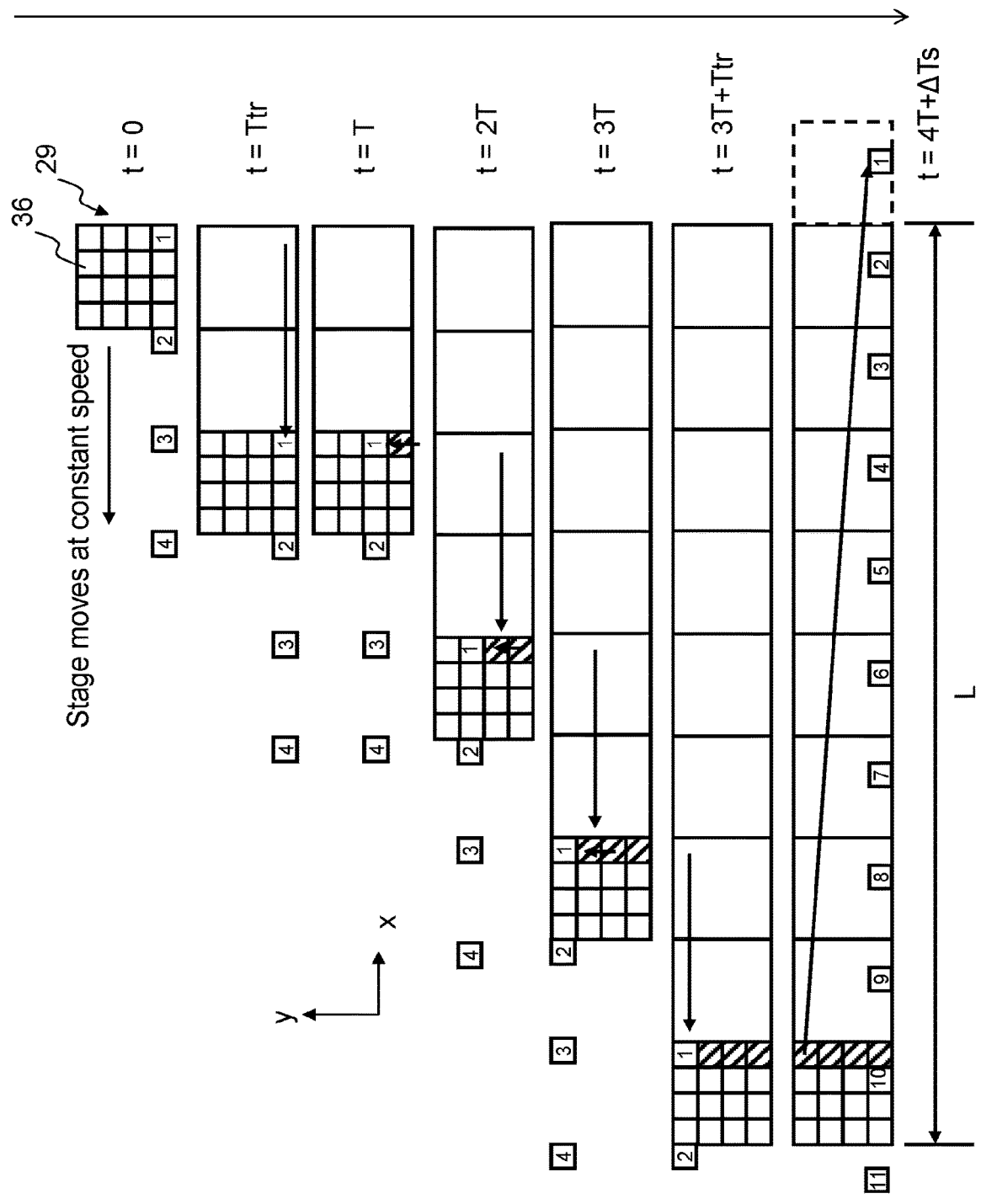
FIG. 9 illustrates an example of a writing sequence of multiple beams according to the first embodiment.

FIG. 9 illustrates an example of a writing sequence of multiple beams according to the first embodiment. In FIG. 9, the operations up to the fourth shot are the same as those of FIG. 6. In FIG. 9, when performing tracking reset after completing the fourth shot, the tracking position is returned, at the time of starting the next tracking control, to the position which is obtained by adding an offset of an integer multiple (nP) of the size of the beam pitch to the tracking starting position of the last tracking control. In the example of FIG. 9, the swing back amount is larger than that of FIG. 6 by the size of a beam pitch P serving as an offset distance (offset amount). Thereby, the sub irradiation region 29 whose first pixel column from the right was written by the beam 1 being a defective beam in the k-th tracking operation is written such that the second pixel column from the right is written not by the defective beam 9 but by the normal beam 10 shifted by one beam from the defective beam 9 in the (k+1)th tracking operation. Then, in each tracking control, by performing swinging back whose amount has been added by the size of the beam pitch P as an offset distance, the third pixel column from the right can be written not by the defective beam 17 but by the normal beam 19 shifted by two beams from the defective beam 17 in the (k+2)th tracking operation. The fourth pixel column from the right can be written not by the defective beam 25 but by the normal beam 28 shifted by three beams from the defective beam 25 in the (k+3)th tracking operation.

Figure 10A:
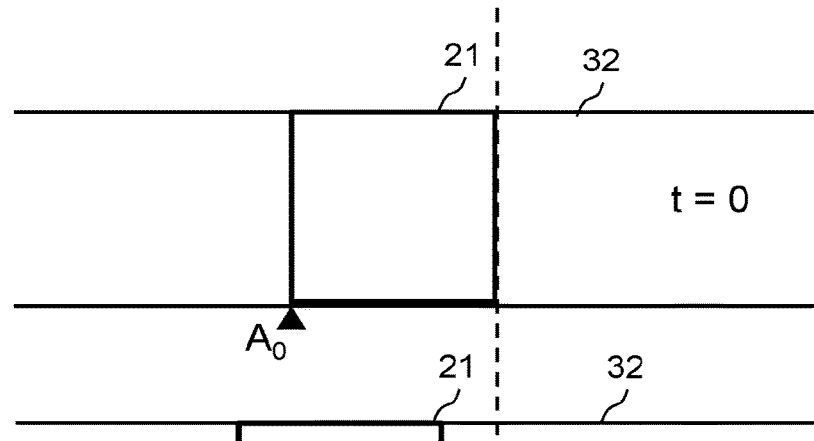
FIGS. 10A to 10C illustrate tracking control according to the first embodiment.
Figure 10B:
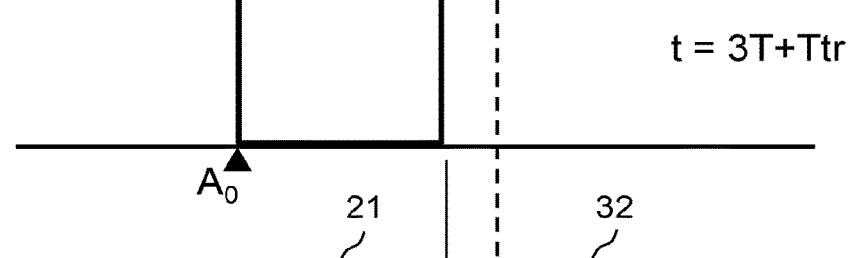
Figure 10C:
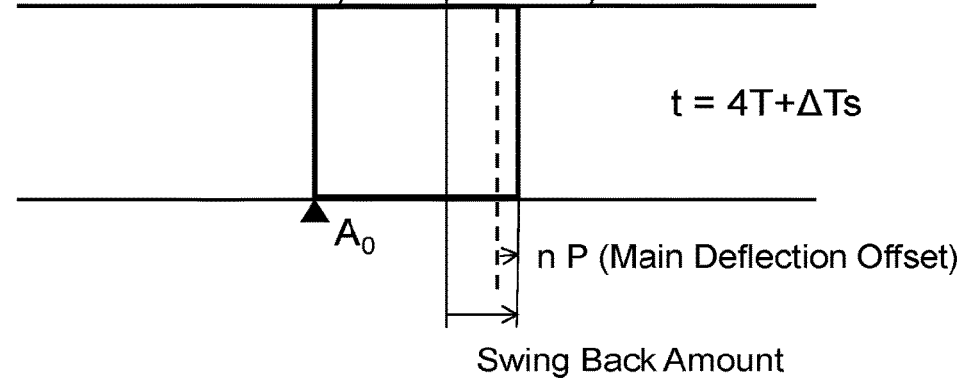

FIGS. 10A to 10C illustrate tracking control according to the first embodiment. In FIGS. 10A to 10C, in order to follow the movement of the XY stage 105, the main deflector 208 performs tracking deflection with respect to the reference position A0 of a region 21 in the writing target stripe region 32 corresponding to the irradiation region 34 that can be irradiated by one irradiation with the multiple beams 20 at the time of tracking start. In FIG. 10A, the reference position A0 at the time of tracking start (time t=0) moves, for example, eight beam pitches in the −x direction at the time of t=4T. In the meantime, the main deflector 208 continues tracking. Then, the beam is swung back by resetting tracking at the time of t=3T+Ttr shown in FIG. 10B, and when the next tracking control is started, the region 21 in the writing target stripe region 32 corresponding to the irradiation region 34 moves to the region which is away from the last region by total (8+nP) beam pitches obtained by adding an offset of an integer multiple (nP) of the beam pitch to the region away from the last region by eight beam pitches in the x direction. Then, the next tracking is started. By repeating this operation, the tracking cycle is carried out. The main deflection settling is started after resetting tracking at the time of t=3T+Ttr, and the next tracking control is started when the main deflection settling time period including the time t=4T shown in FIG. 10C has elapsed (t=4T+ΔTs). Since the XY stage 105 is moving at the constant speed also during this time period, it goes without saying that the swing back whose amount has been added by a distance obtained by multiplying ΔTs by the movement speed of the XY stage 105 is performed when resetting tracking.

Figures 11A, 11B, 11C:
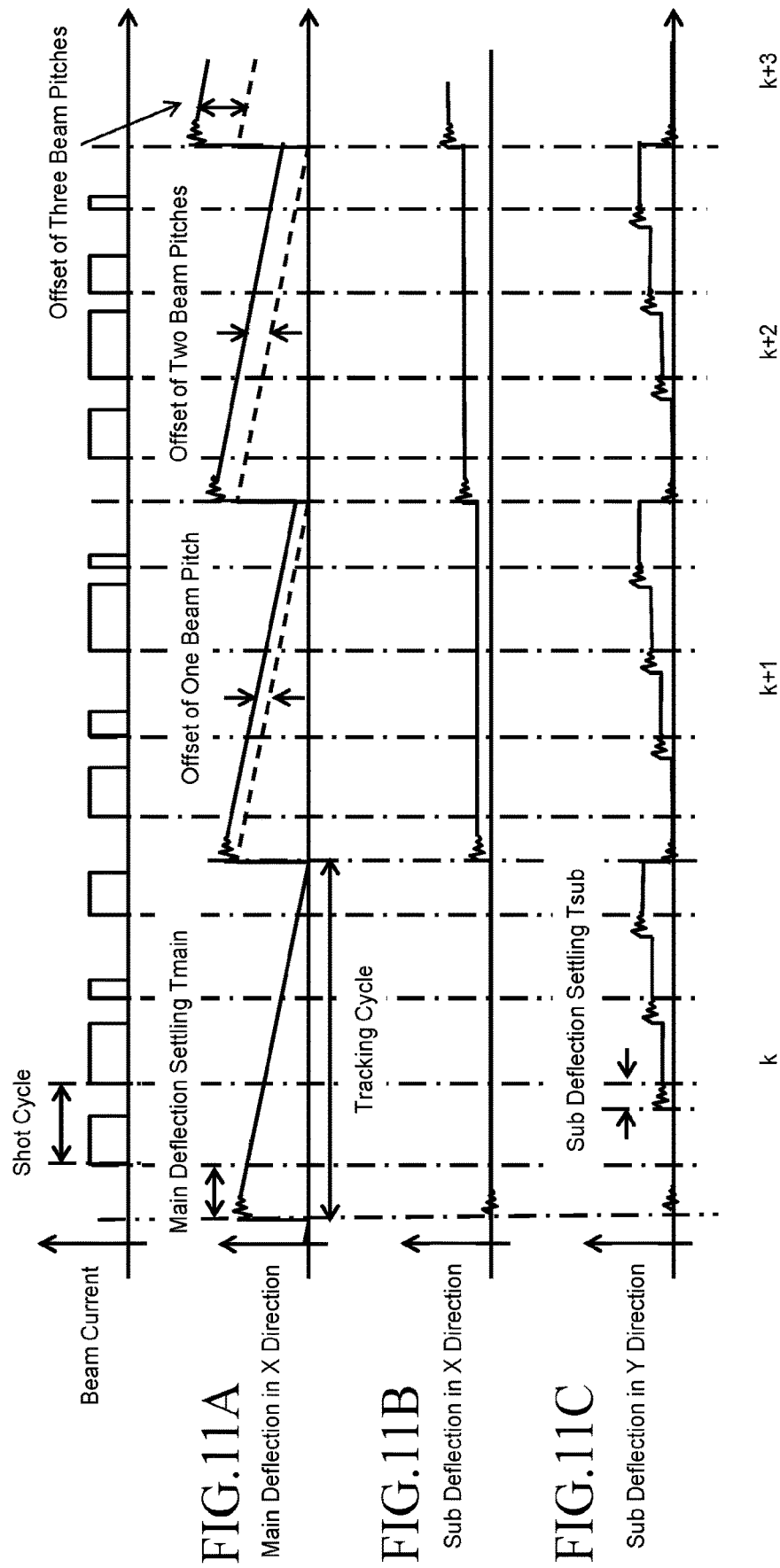
FIGS. 11A to 11C show examples of a relation between deflection voltage and time according to the first embodiment.

FIGS. 11A to 11C show examples of a relation between deflection voltage and time according to the first embodiment. In FIG. 11A, the ordinate axis represents deflection voltage Vtr output from the DAC amplifier (unit) 134 for tracking, and the abscissa axis represents time t. In FIG. 11B, the ordinate axis represents deflection voltage Vx in the x direction output from the DAC amplifier (unit) 132 for the sub deflector 209, and the abscissa axis represents time t. In FIG. 11C, the ordinate axis represents deflection voltage Vy in the y direction output from the DAC amplifier (unit) 132 for the sub deflector 209, and the abscissa axis represents time t. In the case of FIG. 1, one DAC amplifier 132 is shown as a DAC amplifier unit for the sub deflector 209. When the sub deflector 209 can deflect in the x and y directions, it is configured by four or more electrodes (or poles) (e.g., eight electrodes), and the DAC amplifier is connected to each electrode. In the case of FIG. 1, one DAC amplifier 134 is shown as a DAC amplifier unit for the main deflector 208. When the main deflector 208 can deflect in the x and y directions, it is configured by four or more electrodes (or poles) (e.g., eight poles), and the DAC amplifier is connected to each electrode. As shown in FIG. 11A, when performing the (k+1)th tracking control after the k-th tracking control, the voltage to which the offset voltage for one beam pitch has been added is applied in the x direction of main deflection. Then, when performing the (k+2)th tracking control, the voltage to which the offset voltage for two beam pitches has been added is applied in the x direction of main deflection. Then, when performing the (k+3)th tracking control, the voltage to which the offset voltage for three beam pitches has been added is applied in the x direction of main deflection. Thereby, the irradiation beam can be shifted by the beam deflection for tracking control by the main deflector 208.

Figure 12:
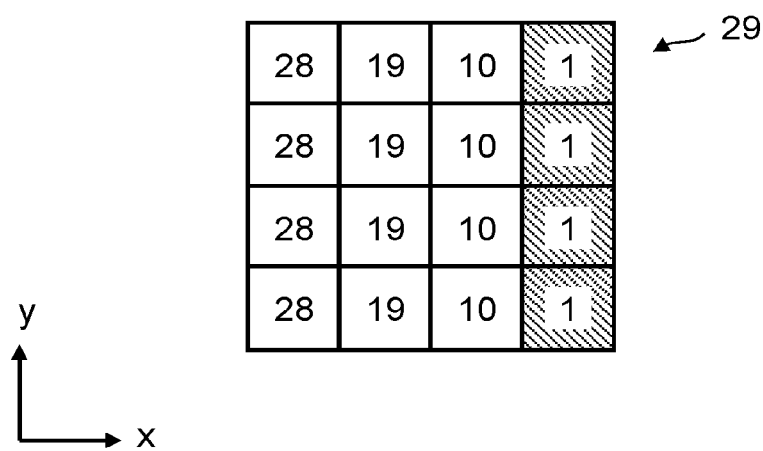
FIG. 12 illustrates an example of a writing situation of a sub irradiation region in the case of a beam swing back amount and an occurrence (generation) cycle of a plurality of defective beams being equivalent (consistent) to each other according to the first embodiment.

FIG. 12 illustrates an example of a writing situation of a sub irradiation region in the case of a beam swing back amount and an occurrence (generation) cycle of a plurality of defective beams being equivalent (consistent) to each other according to the first embodiment. As shown in FIGS. 9 to 11C, the writing processing is performed based on a writing sequence in which swinging back with the amount having been added by the size of beam pitch P as an offset distance is carried out for each tracking control. When the first pixel column from the right in the sub irradiation region 29 concerned is written by the beam 1, the second pixel column from the right can be written by the normal beam 10 instead of by the defective beam 9. The third pixel column from the right can be written by the normal beam 19 instead of by the defective beam 17. The fourth pixel column from the right can be written by the normal beam 28 instead of by the defective beam 25. Thus, even when the beam swing back amount and the occurrence (generation) cycle of a plurality of defective beams are equivalent (consistent) to each other, being eight beam pitches, it is possible to reduce the number of pixels written by defective beams in the sub irradiation region 29. Specifically, since not all the sixteen pixels in the sub irradiation region 29 concerned are written by defective beams and only the four pixels indicated by oblique lines are written by the defective beams, the region written by the defective beam is reduced to one-fourth (¼) of the sub irradiation region 29 concerned.

FIGS. 13A to 13D illustrate examples of a plurality of writing sequences in the case of an offset distance being variable according to the first embodiment. In FIGS. 13A to 13D, each frame indicates the sub irradiation region 29, and the frames arrayed perpendicularly are the same sub irradiation regions 29. Each number in the frame indicates a beam number. The hatched frame shows the sub irradiation region 29 irradiated with a defective beam, and the number of the defective beam irradiating the hatched frame is a serial number from the adjacent frame. A of (A, B) indicates the number of times of tracking control, and B indicates a value of a multiple of the size of the beam pitch P used as an offset distance. Therefore, for example, (k+1, 1) shows the case where the (k+1)th tracking control is performed from the position which is offset in the +x direction by one time the size of the beam pitch P as a swing back amount at the k-th tracking reset.

As a comparative example, FIG. 13A shows the case of performing the writing sequence in FIG. 6 of not performing offset. Therefore, the sub irradiation region 29 irradiated with any of the defective beams 1, 9, 17, and 25 in the k-th tracking control is also irradiated with any of the defective beams 1, 9, 17, and 25 even in the (k+1)th tracking control. Similarly, even in the (k+2)th tracking control, it is irradiated with any of the defective beams 1, 9, 17, and 25. Similarly, even in the (k+3)th tracking control, it is irradiated with any of the defective beams 1, 9, 17, and 25. Therefore, when performing writing per four pixels in one tracking control, the maximum number of defective pixels is sixteen.

In contrast, FIG. 13B shows an example of a writing sequence with an offset by tracking deflection for each tracking control. FIG. 13B shows the case of performing the writing sequence of FIG. 9 in which swinging back whose amount has been added by the size of the beam pitch P as an offset distance is performed. As shown in FIG. 13B, it turns out that each sub irradiation region 29 irradiated with a defective beam can be shifted one by one for each tracking control. Therefore, when performing writing per four pixels in one tracking control, the maximum number of defective pixels can be four.

Now, with respect to the position where a defective beam occurs, it does not always have periodicity. A defective beam may occur at a random position. For example, FIG. 13C in which particulate waste adhering to a portion of a plurality of passage holes of the blanking aperture array mechanism 204 may prevent a beam from passing shows another example of the writing sequence with an offset by tracking deflection for each tracking control according to the first embodiment. FIG. 13C shows the case where, as a random defect, the beam 7 is further added as a defective beam. In FIG. 13C, the sub irradiation region 29 having been irradiated with any of the defective beams 1, 7, 9, 17, and 25 in the k-th tracking control starts the tracking control at the position which is offset by the size of the beam pitch P in the +x direction in the (k+1)th tracking control. Therefore, it turns out that the sub irradiation region 29 irradiated with a defective beam can be shifted by one sub irradiation region 29 compared to the case of the k-th tracking control. The (k+2)th tracking control starts from the position which is offset by the size of two beam pitches P in the +x direction. Therefore, it turns out that the sub irradiation region 29 irradiated with a defective beam can be shifted by two sub irradiation regions 29 compared to the case of the k-th tracking control. The (k+3)th tracking control starts from the position which is offset by the size of four beam pitches P in the +x direction. Therefore, it turns out that the sub irradiation region 29 irradiated with a defective beam can be shifted by four sub irradiation regions 29 compared to the case of the k-th tracking control. However, in the example of FIG. 13C, the sub irradiation region 29 (A portion) having been irradiated with the defective beam 7 in the k-th tracking control is irradiated with the defective beam 9 in the (k+2)th tracking control. Similarly, the sub irradiation region 29 (A' portion) having been irradiated with the defective beam 7 in the (k+2)th tracking control is irradiated with defective beam 17 in the (k+3)th tracking control. Therefore, when performing writing per four pixels in one tracking control, the maximum number of defective pixels can be eight.

FIG. 13D shows another example of a writing sequence with an offset by tracking deflection for each tracking control according to the first embodiment. FIG. 13D shows the case of an offset different from that of FIG. 13C. In FIG. 13D, the sub irradiation region 29 having been irradiated with any of the defective beams 1, 7, 9, 17, and 25 in the k-th tracking control starts a tracking control at the position which is offset by the size of the beam pitch P in the +x direction in the (k+1)th tracking control. Therefore, it turns out that the sub irradiation region 29 irradiated with a defective beam can be shifted by one sub irradiation region 29 in the +x direction compared to the case of the k-th tracking control. The (k+2)th tracking control starts from the position which is offset by the size of one beam pitch P in the −x direction. Therefore, it turns out that the sub irradiation region 29 irradiated with a defective beam can be shifted by one sub irradiation region 29 in the −x direction compared to the case of the k-th tracking control. The (k+3)th tracking control starts from the position which is offset by the size of four beam pitches P in the +x direction. Therefore, it turns out that the sub irradiation region 29 irradiated with a defective beam can be shifted by four sub irradiation regions 29 compared to the case of the k-th tracking control. In FIG. 13D, the starting position of the (k+2)th tracking control is different from that of FIG. 13C. Thereby, it is possible to avoid the sub irradiation region 29 having been irradiated with the defective beam 7 in the k-th tracking control to be irradiated with a defective beam again. However, the sub irradiation region 29 (A" portion) having been irradiated with the defective beam 7 in the (k+2)th tracking control is irradiated with the defective beam 1 in the (k+1)th tracking control. Therefore, when performing writing per four pixels in one tracking control, the maximum number of defective pixels can be eight.

As described above, according to the first embodiment, it is possible to reduce the number of pixels irradiated with a defective beam in each small region when a beam swing back amount (distance) in resetting the tracking operation and a distance between beams of a plurality of defective beams are equivalent (consistent) to each other.

Preferably, in the first embodiment, as shown in FIGS. 13A to 13D, a writing sequence without performing an offset, and a plurality of writing sequences with an offset distance and direction being variable are prepared in advance, for example. A plurality of writing sequences with an offset distance and direction being variable are not limited to the examples of FIGS. 13A to 13D, and other writing sequences, in which an offset distance and a direction are variable, are also preferable. In the case of previously preparing a plurality of writing sequences with an offset distance and direction being variable, information on a writing sequence without performing an offset and a plurality of writing sequences 1, 2, 3, 4, and so on including plural writing sequences with an offset distance and direction being variable is input from the outside of the writing apparatus 100, and stored in the storage device 144. Hereafter, the first embodiment describes a writing method in the case of being able to select a plurality of writing sequences.

In the maximum number of defective pixels calculation step (S104), with respect to a plurality of writing sequences prepared in advance, the maximum number of defective pixels calculation unit 52 calculates a maximum number of defective pixels for each writing sequence when performing writing with the multiple beams 20 including a detected defective beam. The maximum number of defective pixels indicates the number of pixels irradiated with a defective beam in the sub irradiation region 29 whose number of pixels irradiated with a defective beam is the largest in all the sub irradiation regions 29 in the writing region 30 or the stripe region 32 of the target object 101. In the example of FIG. 13A described above, the maximum number of defective pixels is sixteen. In the example of FIG. 13B, the maximum number of defective pixels is four. In the examples of FIGS. 13C and 13D, the maximum number of defective pixels is eight. However, since the number of defective beams in the examples of FIGS. 13C and 13D is different from that of FIG. 13B, it is needless to say that it cannot be simply compared as they are.

In the writing sequence selection step (S108), the writing sequence selection unit 54 selects a writing sequence in which the maximum number of defective pixels is smaller in a plurality of writing sequences. In other words, the writing sequence selection unit 54 selects, with respect to the k-th tracking control, an offset distance to be used for the (k+1)th tracking control from a plurality of preset offset distances.

In the irradiation time data generation step (S110), the irradiation time data generation unit 56 generates irradiation time data for each pixel 36. The irradiation time data generation unit 56 reads writing data from the storage device 140, and performs a plurality of stages (steps) of data conversion processing to generate irradiation time data. The irradiation time data is generated for each pixel 36, and then, the writing time (irradiation time) is calculated. For example, when no pattern is formed in a target pixel 36, since beam irradiation is not performed, an identification code indicating writing time zero or no beam irradiation is defined. Here, a maximum writing time Ttr (maximum exposure time) in one shot of multiple beams is set in advance. It is preferable that the irradiation time of each beam to be actually applied is obtained in proportion to a calculated pattern area density. Moreover, it is preferable that the irradiation time of each beam to be finally calculated is a time period equivalent to a dose after being corrected, based on the dose, with respect to a dimension variation amount generated due to a phenomenon (not shown) such as a proximity effect, a fogging effect result, and a loading effect. Further, it is preferable that the irradiation time of each beam to be finally calculated is a time period equivalent to a dose after correcting positional deviation generated due to other factors, based on distribution of the dose of a plurality of pixels including circumferential pixels. Therefore, the irradiation time of each beam to be actually applied may be different from each other. The writing time (irradiation time) of each beam is obtained as a value within the maximum writing time Ttr.

In the data array processing step (S112), the data processing unit 58 processes irradiation time data, based on a selected writing sequence, such that each beam associated with each pixel is assigned and irradiation time data of each beam is arrayed in the order of shot of the multiple beams 20, and in the order of array of the shift register 11.

In the data transmission step (S114), the writing control unit 59 transmits processed irradiation time data to the deflection control circuit 130.

In the writing step (S120), the writing mechanism 150 writes a pattern on the target object 101 with the multiple beams 20 in accordance with the selected writing sequence. While the writing mechanism 150 performs the k-th tracking control (k being a natural number) by beam deflection such that the writing position of each of the multiple beams collectively follows the movement of the stage, a plurality of shots of the multiple beams are performed during a period of each tracking control while collectively shifting the irradiation positions of the multiple beams so that the irradiation position of each beam may be shifted in the corresponding sub irradiation region 29. The sub irradiation regions 29 different from each other are irradiated with each beam, and each sub irradiation region 29 (rectangular, including square, region) is surrounded by the size of the beam pitch. Specifically, it operates as follows:

In the tracking step (S122), the writing mechanism 150 performs the k-th tracking control (k being a natural number) by beam deflection such that the writing position of each of the multiple beams collectively follows the movement of the stage. Specifically, the laser length measuring system 122 measures the position of the XY stage 105 by irradiating the mirror 210 with a laser and receiving a reflected light from the mirror 210. The measured position of the XY stage 105 is output to the control computer 110. In the control computer 110, the writing control unit 59 outputs the position information on the XY stage 105 to the deflection control circuit 130. While being in accordance with the movement of the XY stage 105, the deflection control circuit 130 calculates main deflection amount data (tracking deflection data) for deflecting beams to follow the movement of the XY stage 105. The tracking deflection data being a digital signal is output to the DAC amplifier 134. The DAC amplifier 134 converts the digital signal to an analog signal and amplifies it to be applied as a tracking deflection voltage to the main deflector 208.

In the shot step (S124), while the writing mechanism 150 performs the k-th tracking control (k being a natural number), each pixel in the sub irradiation region 29 (rectangular, including square, region) surrounded by the size of the beam pitch P, where the sub irradiation regions 29 are different from each other, is irradiated with each beam during a period of each tracking control. (Beam irradiation of the first shot is performed.)

In the shift step (S126), while performing the k-th tracking control (k being a natural number), the writing mechanism 150 collectively shifts the pixel 36 to be irradiated with each beam during a period of each tracking control, by beam deflection of the sub deflector 209, to the next pixel in the sub irradiation region 29 (rectangular, including square, region) surrounded by the size of the beam pitch P, where the sub irradiation regions 29 are different from each other.

In the shot step (S128), while the writing mechanism 150 performs the k-th tracking control (k being a natural number), the pixel shifted in the sub irradiation region 29 (rectangular, including square, region) surrounded by the size of the beam pitch P, where the sub irradiation regions 29 are different from each other, is irradiated with each beam during a period of each tracking control. (Beam irradiation of the second shot is performed.)

The shift step (S126) and the shot step (S128) are repeated until the number of shots per tracking control, (e.g., four times), have been performed. Thereby, beam irradiation of the third shot and beam irradiation of the fourth shot are performed.

In the tracking reset step (S129), after the k-th tracking control period has passed, the writing mechanism 150 returns, by beam deflection by the main deflector 208 for tracking control, the tracking position to the position which is obtained by adding an offset of an integer multiple of the size of the beam pitch P to the tracking starting position of the k-th tracking control, to be as the starting position of the (k+1)th tracking control. In the example of FIG. 9, it is returned to the position to which an offset of the size of the beam pitch P in the +x direction has been added.

While performing a next tracking control, the shift step and the shot step are repeated until the number of shots per tracking control, (e.g., four times), have been performed. Subsequently, each internal step in the writing step (S120) is repeated in the same way.

Then, after completing writing one stripe region 32, the irradiation region 34 is moved to the next stripe region 32 by movement of the XY stage 105, and the same operation is repeated.

The above examples describe the case of selecting one writing sequence with respect to subsequent writing processing, by carrying out the defective beam detection step (S102) before starting writing. However, it is not limited thereto. It is also preferable to execute the defective beam detection step (S102), for example, at every completion of writing processing of some stripe regions 32 in addition to executing it before starting writing. Further, there is a case where although writing processing has started based on a writing sequence without offset because no defective beam was detected before starting writing, a defective beam is detected after completing writing processing of some stripe regions 32. In such a case, with respect to writing of the stripe region 32 after the defective beam was detected, it is sufficient to execute the maximum number of defective pixels calculation step (S104), the writing sequence selection step (S108), and the data array processing step (S112) based on a selected writing sequence. In other words, the writing mechanism 150 returns, by beam deflection for tracking control, the tracking position to the position which is obtained by adding an offset of an integer multiple of the size of the beam pitch to the tracking starting position of the k-th tracking control after detecting the defective beam, to be as the starting position of the (k+1)th tracking control after detecting the defective beam. Then, the (k+1)th tracking control is started.

As described above, according to the first embodiment, it is possible to reduce the number of pixels irradiated with a defective beam in each sub irradiation region 29 (small region) when a beam swing back amount (distance) in resetting the tracking operation and a distance between beams of a plurality of defective beams are equivalent (consistent) to each other. Accordingly, degradation of writing accuracy can be reduced.

Second Embodiment

Although the first embodiment describes the case where, when swinging back the tracking position of the multiple beams 20 by resetting tracking, an offset is performed in the opposite swing back direction (x direction) to the tracking direction (−x direction) or in the same direction (−x direction) as the tracking direction (−x direction) by the main deflector 208 for tracking control, it is not limited thereto. According to a second embodiment, offset is performed in the direction (y direction) perpendicular to the swing back direction (x direction). The configuration of the writing apparatus 100 in the second embodiment is the same as that of FIG. 1. Moreover, the flowchart of the writing method in the second embodiment is the same as that of FIG. 8. The contents of the second embodiment are the same as those of the first embodiment except what is particularly described below.

FIGS. 14A to 14D illustrate tracking control according to the second embodiment. In FIGS. 14A to 14D, the main deflector 208 can deflect the multiple beams 20 collectively in the direction other than the tracking direction (−x direction) or the swing back direction (x direction). According to the second embodiment, an offset is performed in the direction (y direction) perpendicular to the swing back direction (x direction). With respect to (A, B, C), A indicates the number of times of tracking control, B indicates a value of a multiple of the size of the beam pitch P used as an offset distance in the x direction, and C indicates a value of a multiple of the size of the beam pitch P used as an offset distance in the y direction. Therefore, for example, (k+1, 1, 1) indicates the case in which the (k+1)th tracking control is performed (started) from the position where an offset is performed in the +x direction by one time the size of the beam pitch P as a swing back amount at the time of the k-th tracking reset, and is performed in the +y direction by one time the size of the beam pitch P.

First, as shown in FIG. 14A, in the k-th tracking control (k, 0, 0), in order to follow the movement of the XY stage 105, tracking deflection is performed with respect to the reference position AO of the region 21 in the writing target stripe region 32 corresponding to the irradiation region 34 at the time of starting tracking. The reference position AO at the time (t=0) of starting tracking moves, for example, eight beam pitches in the −x direction at the time of t=4T. In the meantime, the main deflector 208 continues tracking. Then, the beam is swung back by resetting tracking at the time of t=3T+Ttr. As shown in FIG. 14B, when the next tracking control is started, the region 21 in the writing target stripe region 32 corresponding to the irradiation region 34 moves, by beam deflection by the main deflector 208, to the region which is away from the last region by total (8+nP) beam pitches obtained by adding an offset of an integer multiple (nP) of the beam pitch in the +x direction to the region away from the last region by eight beam pitches in the x direction. Then, the next (k+1)th tracking control is started.

In the (k+1)th tracking control (k+1, 1, 0), in order to follow the movement of the XY stage 105, tracking deflection is performed with respect to the reference position AO of the region 21 in the writing target stripe region 32 corresponding to the irradiation region 34 at the time of starting tracking. The reference position AO at the time (t=0) of starting tracking moves, for example, eight beam pitches in the −x direction at the time of t=4T. In the meantime, the main deflector 208 continues tracking. Then, the beam is swung back by resetting the tracking at the time of t=3T+Ttr. As shown in FIG. 14C, when the next tracking control is started, the region 21 in the writing target stripe region 32 corresponding to the irradiation region 34 is swung back to the region away from the last region by seven beam pitches in the x direction which is obtained by removing (subtracting) the offset distance in the +x direction. Then, in that case, the region 21 moves by beam deflection by the main deflector 208 to the region away by an offset of an integer multiple (nP) of the beam pitch in the +y direction. Then, the next (k+2)th tracking control is started.

In the (k+2)th tracking control (k+2, 0, 1), the tracking control is performed for the region 21 from the position being the same as that of the k-th tracking control in the x direction and shifted in the +y direction by one beam pitch. In the (k+2)th tracking control, in order to follow the movement of the XY stage 105, tracking deflection is performed with respect to the reference position AO of the region 21 in the writing target stripe region 32 corresponding to the irradiation region 34 at the time of starting tracking. The reference position AO at the time (t=0) of starting tracking moves, for example, eight beam pitches in the −x direction at the time of t=4T. In the meantime, the main deflector 208 continues tracking. Then, the beam is swung back by resetting the tracking at the time of t=3T+Ttr. As shown in FIG. 14D, when the next tracking control is started, the region 21 in the writing target stripe region 32 corresponding to the irradiation region 34 moves, by beam deflection by the main deflector 208, to the region which is away from the last region by total (8+nP) beam pitches obtained by adding an offset of an integer multiple (nP) of the beam pitch in the +x direction to the region away from the last region by eight beam pitches in the x direction. Then, the next (k+3)th tracking control is started.

In the (k+3)th tracking control (k+3, 1, 1), the tracking control is performed for the region 21 from the position being the same as that of the (k+1)th tracking control in the x direction and shifted in the +y direction by one beam pitch. In the (k+3)th tracking control, in order to follow the movement of the XY stage 105, tracking deflection is performed with respect to the reference position AO of the region 21 in the writing target stripe region 32 corresponding to the irradiation region 34 at the time of starting tracking. The reference position AO at the time (t=0) of starting tracking moves, for example, eight beam pitches in the −x direction at the time of t=4T. In the meantime, the main deflector 208 continues tracking. Then, the beam is swung back by resetting the tracking at the time of t=3T+Ttr. When the next tracking control is started, the region 21 in the writing target stripe region 32 corresponding to the irradiation region 34 is swung back to the region away from the last region by seven beam pitches in the x direction which is obtained by removing (subtracting) the offset distance in the +x direction as shown in FIG. 14A. At the same time, as shown in FIG. 14A, the region 21 moves by beam deflection by the main deflector 208 to the region away by one beam pitch in the −y direction which is obtained by removing (subtracting) the offset distance in the +y direction. Then, the next (k+4)th tracking control is started. By repeating this operation, the tracking cycle is carried out. The main deflection settling is started after resetting tracking at the time of t=3T+Ttr, and the next tracking control is started when the main deflection settling time period including the time t=4T has elapsed (t=4T+ΔTs). Since the XY stage 105 is moving at the constant speed also during this time period, it goes without saying that the swing back whose amount is added by a distance obtained by multiplying ΔTs by the movement speed of the XY stage 105 is performed when resetting tracking.

Figure 15:
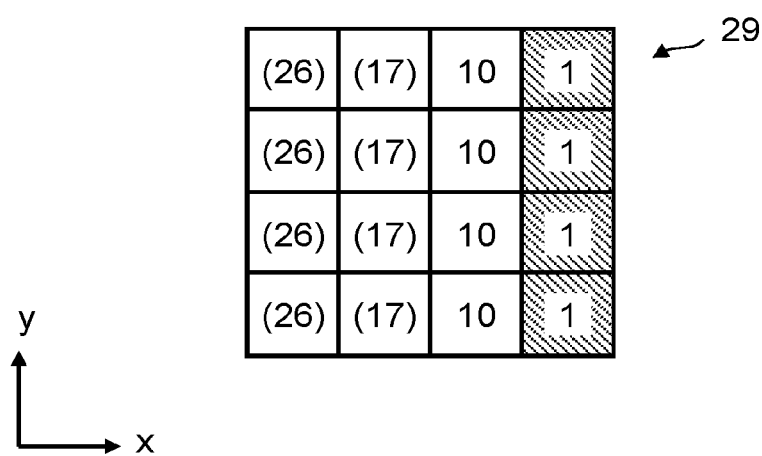
FIG. 15 illustrates an example of a writing situation of a sub irradiation region in the case of a beam swing back amount and an occurrence (generation) cycle of a plurality of defective beams being equivalent (consistent) to each other according to the second embodiment.

FIG. 15 illustrates an example of a writing situation of a sub irradiation region in the case of a beam swing back amount and an occurrence (generation) cycle of a plurality of defective beams being equivalent (consistent) to each other according to the second embodiment. As shown in FIGS. 14A to 14D, the writing processing proceeds, for each tracking control, based on the writing sequence with offset of swing back amounts having been added by the size of a beam pitch P in each of the +x direction and the +y direction. Therefore, when the first pixel column from the right in the sub irradiation region 29 concerned is written by the beam 1, the second pixel column from the right can be written by the normal beam 10 instead of by the defective beam 9. The third pixel column from the right can be written not by the defective beam 17 but by the normal beam (17) which is lower than the defective beam 17 by one row. A parenthetical beam number indicates the number of abeam shifted by one row. The fourth pixel column from the right can be written by the normal beam (26) which is lower than the defective beam 25 by one row and offset by one beam. Thus, even when the beam swing back amount and the occurrence (generation) cycle of a plurality of defective beams are equivalent (consistent) to each other, being eight beam pitches, it is possible to reduce the number of pixels written by defective beams in the sub irradiation region 29. Specifically, since not all the sixteen pixels in the sub irradiation region 29 concerned are written by defective beams and only the four pixels indicated by oblique lines are written by the defective beams, the region written by the defective beam is reduced to one-fourth (¼) of the sub irradiation region 29 concerned.

By performing only offset in the y direction by beam deflection by the main deflector 208, not performing offset in the x direction, it is also possible to reduce the number of pixels in the sub irradiation region 29 written by a defective beam. Thus, for example, an offset (0, 0) in the k-th tracking control, an offset (0, 1) in the (k+1)th tracking control, an offset (0, 2) in the (k+2)th tracking control, and an offset (0, 3) in the (k+3)th tracking control may be performed. A parenthetical numerical value indicates a value of a multiple of the size of the beam pitch P serving as an offset distance in the x and y directions at the tracking starting position. However, if the offset distance in the y direction is large, since the deviation distance of the irradiation region 34 from the stripe region 32 also becomes large, the offset distance in the y direction is desirably small such as one time the offset distance.

As described above, according to the second embodiment, the number of pixels in the sub irradiation region 29 written by a defective beam can be reduced by performing an offset in the y direction or performing combining an offset in the x direction and that in the y direct by beam deflection by the main deflector 208.

Third Embodiment

Although the second embodiment describes the case where the main deflector 208 used for tracking control performs beam deflection for offset, the method of beam deflection for an offset is not limited thereto. According to a third embodiment, the sub deflector 209 used for shift deflection in the sub irradiation region 29 performs beam deflection for offset. The configuration of the writing apparatus 100 in the third embodiment is the same as that of FIG. 1. Moreover, the flowchart of the writing method in the third embodiment is the same as that of FIG. 8. The contents of the third embodiment are the same as those of the first embodiment or the second embodiment except what is particularly described below.

According to the third embodiment, in the shift step (S126), during tracking controlling, the multiple beams 20 are collectively deflected to the position to which the writing position of each beam is offset by an offset distance of an integer multiple (nP) of the size of the beam pitch P, using the sub deflector 209 which is different from the main deflector 208 used for beam deflection for tracking control.

FIGS. 16A to 16D illustrate tracking control according to the third embodiment. In FIGS. 16A to 16D, the sub deflector 209 can collectively deflect the multiple beams 20 by the deflection width larger than the size of the sub irradiation region 29. Furthermore, the sub deflector 209 can perform offset deflection in addition to shift deflection in the sub irradiation region 29.

Figure 16A:
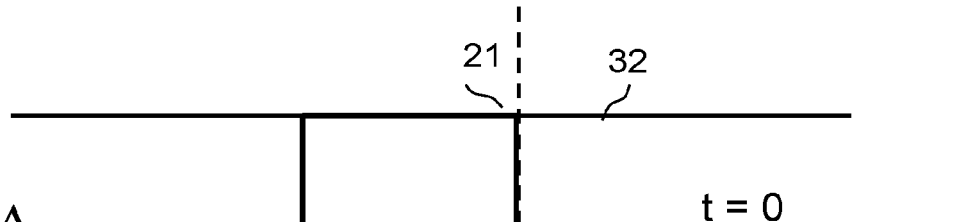
FIGS. 16A to 16D illustrate tracking control according to a third embodiment.

First, as shown in FIG. 16A, in the k-th tracking control, in order to follow the movement of the XY stage 105, the main deflector 208 performs tracking deflection with respect to the reference position AO of the region 21 in the writing target stripe region 32 corresponding to the irradiation region 34 at the time of starting tracking. The reference position AO at the time (t=0) of starting tracking moves, for example, four beam pitches in the −x direction at the time of t=2T. In the meantime, the main deflector 208 continues tracking. On the other hand, during this period, the sub deflector 209 shifts, after the maximum writing time Ttr of the first shot has elapsed, the writing position (writing position of the first shot) of each beam to the next writing position (writing position of the second shot) of each beam by collectively deflecting the multiple beams 20.

Figure 16B:
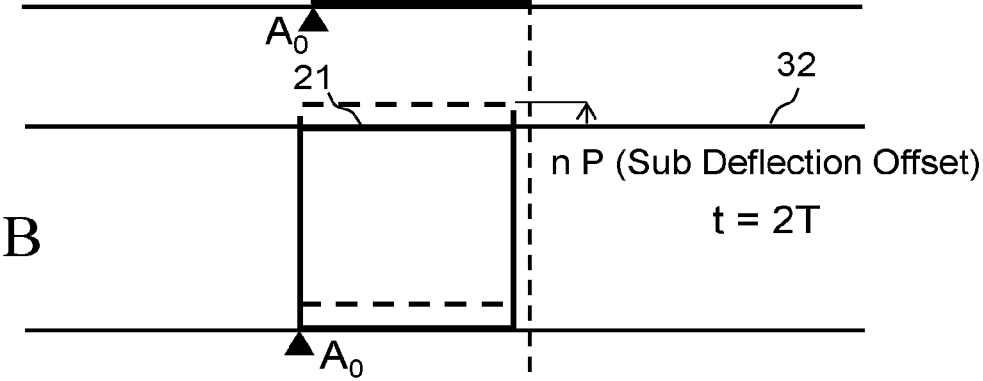

After the maximum writing time Ttr of the second shot has elapsed, the writing position (writing position of the second shot) of each beam is shifted to the writing position (writing position of the third shot) of each beam by collectively deflecting the multiple beams 20. When performing this deflection, the sub deflector 209 shifts the writing position (writing position of the third shot) of each beam by performing beam deflection by an offset of an integer multiple of (nP) of the beam pitch in the +y direction. As shown in FIG. 16B, when it becomes the time t=2T, the sub deflector 209 collectively deflects the multiple beams 20 to shift the writing target pixel from the first pixel from the right in the second row from the bottom in the sub irradiation region 29 concerned to the first pixel from the right in the third row from the bottom in the next sub irradiation region 29 which is adjacent in the y direction to the sub irradiation region 29 concerned. As shown in FIG. 16B, although the region 21 (solid line) in the writing target stripe region 32 where tracking control is performed by the main deflector 208 is not offset in the y direction, the irradiation region 34 (dotted line) to be actually irradiated with the multiple beams 20 is offset in the y direction by beam deflection by the sub deflector 209.

Figure 16C:
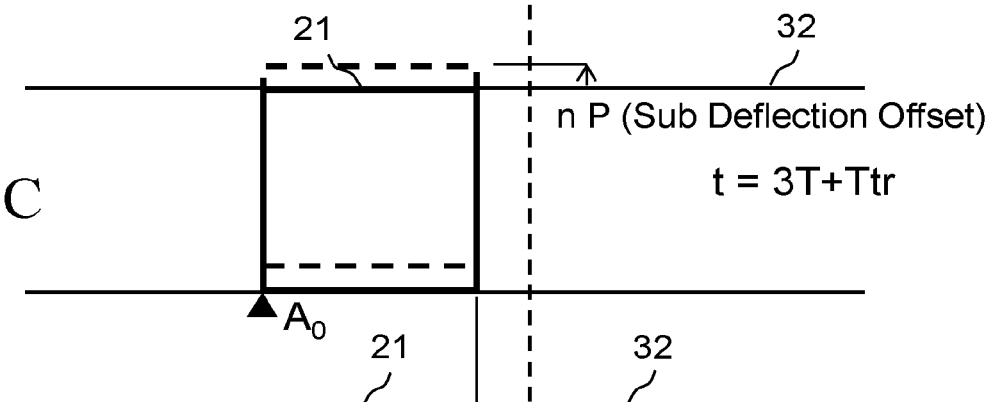

After the maximum writing time Ttr of the third shot has elapsed, the sub deflector 209 shifts the writing position (writing position of the third shot) of each beam to the writing position (writing position of the fourth shot) of each beam by collectively deflecting the multiple beams 20. In the meantime, the main deflector 208 performs tracking deflection with respect to the reference position AO of the region 21 to follow the movement of the XY stage 105. The reference position AO at the time of tracking start (time t=0) moves, for example, eight beam pitches in the −x direction at the time of t=4T. In the meantime, the main deflector 208 continues tracking. Then, as shown in FIG. 16C, tracking is reset at the time t=3T+Ttr when the maximum writing time Ttr of the fourth shot has elapsed.

Figure 16D:
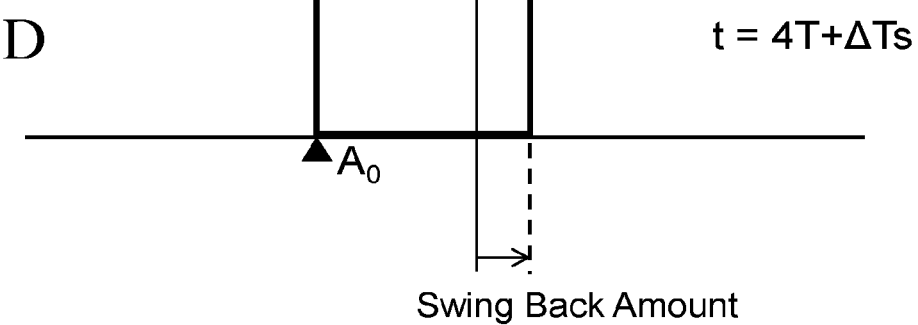

The beam is swung back by resetting tracking at the time of t=3T+Ttr. As shown in FIG. 16D, when the next tracking control is started, the region 21 (solid line) in the writing target stripe region 32 corresponding to the irradiation region 34 moves, by beam deflection by the main deflector 208, to the region which is away from the last region by eight beam pitches in the x direction. Thereby, as shown in FIG. 16D, the region 21 (solid line) in the writing target stripe region 32 where tracking control is performed by the main deflector 208 is returned to the starting position of the k-th tracking control. Then, the next (k+1)th tracking control is started.

FIGS. 17A to 17C show examples of a relation between deflection voltage and time according to the third embodiment. In FIG. 17A, the ordinate axis represents deflection voltage Vtr output from the DAC amplifier (unit) 134 for tracking, and the abscissa axis represents time t. In FIG. 17B, the ordinate axis represents deflection voltage Vx in the x direction output from the DAC amplifier (unit) 132 for the sub deflector 209, and the abscissa axis represents time t. In FIG. 17C, the ordinate axis represents deflection voltage Vy in the y direction output from the DAC amplifier (unit) 132 for the sub deflector 209, and the abscissa axis represents time t. As shown in FIG. 17A, when the (k+1)th tracking control is performed after the k-th tracking control, the voltage for an offset of one beam pitch in the x direction of main deflection is not added. Similarly, when the (k+2)th tracking control is performed, the voltage for an offset of two beam pitches in the x direction of main deflection is not added. Similarly, when the (k+3)th tracking control is performed, the voltage for an offset of three beam pitches in the x direction of main deflection is not added. On the other hand, during the k-th tracking control, when the writing position of the second shot shifts to the writing position of the third shot, as shown in FIG. 17C, the voltage for an offset of one beam pitch in the y direction of sub deflection is added. Similarly, during the (k+1)th tracking control, when the writing position of the second shot shifts to the writing position of the third shot, the voltage for an offset of one beam pitch in the y direction of sub deflection is added. Similarly, during the (k+2)th tracking control, when the writing position of the second shot shifts to the writing position of the third shot, the voltage for an offset of one beam pitch in the y direction of sub deflection is added. Similarly, during the (k+3)th tracking control, when the writing position of the second shot shifts to the writing position of the third shot, the voltage for an offset of one beam pitch in the y direction of sub deflection is added. Thereby, the irradiation beam can be shifted by beam deflection by the sub deflector 209.

Figure 18:
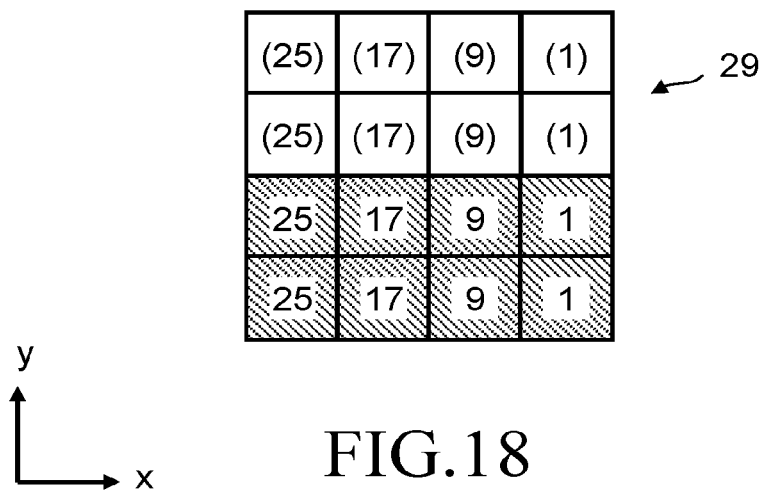
FIG. 18 illustrates an example of a writing situation of a sub irradiation region in the case of a beam swing back amount and an occurrence (generation) cycle of a plurality of defective beams being equivalent (consistent) to each other according to the third embodiment.

FIG. 18 illustrates an example of a writing situation of a sub irradiation region in the case of a beam swing back amount and an occurrence (generation) cycle of a plurality of defective beams being equivalent (consistent) to each other according to the third embodiment. As shown in FIGS. 17A to 17C, when performing shift deflection during tracking control, the writing processing is carried out based on a writing sequence in which shifting by the amount having been added by the size of beam pitch P in the +y direction as an offset distance is performed. When the first pixel column from the right in the sub irradiation region 29 concerned is written, although the first two pixels from the right in the first and second rows from the bottom are written by the defective beam 1, the first two pixels from the right in the third and fourth rows from the bottom can be written not by the defective beam 1 but by the normal beam (1) which is lower than the defective beam 1 by one row. Similarly, when the second pixel column from the right in the sub irradiation region 29 concerned is written, although the second two pixels from the right in the first and second rows from the bottom are written by the defective beam 9, the second two pixels from the right in the third and fourth rows from the bottom can be written not by the defective beam 9 but by the normal beam (9) which is lower than the defective beam 9 by one row. Similarly, when the third pixel column from the right in the sub irradiation region 29 concerned is written, although the third two pixels from the right in the first and second rows from the bottom are written by the defective beam 17, the third two pixels from the right in the third and fourth rows from the bottom can be written not by the defective beam 17 but by the normal beam (17) which is lower than the defective beam 17 by one row. Similarly, when the fourth pixel column from the right in the sub irradiation region 29 concerned is written, although the fourth two pixels from the right in the first and second rows from the bottom are written by the defective beam 25, the fourth two pixels from the right in the third and fourth rows from the bottom can be written not by the defective beam 25 but by the normal beam (25) which is lower than the defective beam 25 by one row. Thus, even when the beam swing back amount and the occurrence (generation) cycle of a plurality of defective beams are equivalent (consistent) to each other, being eight beam pitches, it is possible to reduce the number of pixels written by defective beams in the sub irradiation region 29. Specifically, since not all the sixteen pixels in the sub irradiation region 29 concerned are written by defective beams and only the eight pixels indicated by oblique lines are written by the defective beams, the region written by the defective beam is reduced to half (½) of the sub irradiation region 29 concerned.

Figure 19:
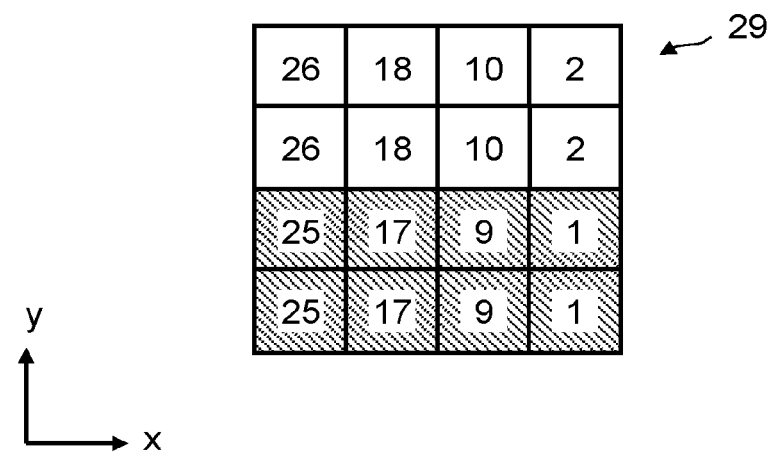
FIG. 19 illustrates another example of a writing situation of a sub irradiation region in the case of a beam swing back amount and an occurrence (generation) cycle of a plurality of defective beams being equivalent (consistent) to each other according to the third embodiment.

FIG. 19 illustrates another example of a writing situation of a sub irradiation region in the case of a beam swing back amount and an occurrence (generation) cycle of a plurality of defective beams being equivalent (consistent) to each other according to the third embodiment. FIG. 18 describes the writing sequence in which, when performing shift deflection during tracking control, shifting by the amount having been added by the size of the beam pitch P in the +y direction as an offset distance is carried out. However, it is not limited thereto. FIG. 19 describes the case where, when performing shift deflection during tracking control, the writing processing is carried out based on a writing sequence in which shifting by the amount having been added by the size of the beam pitch P in the +x direction as an offset distance is performed. Thus, in FIG. 19, when the first pixel column from the right in the sub irradiation region 29 concerned is written, although the first two pixels from the right in the first and second rows from the bottom are written by the defective beam 1, the first two pixels from the right in the third and fourth rows from the bottom can be written by the normal beam 2 instead of by the defective beam 1. Similarly, when the second pixel column from the right in the sub irradiation region 29 concerned is written, although the second two pixels from the right in the first and second rows from the bottom are written by the defective beam 9, the second two pixels from the right in the third and fourth rows from the bottom can be written by the normal beam 10 instead of by the defective beam 9. Similarly, when the third pixel column from the right in the sub irradiation region 29 concerned is written, although the third two pixels from the right in the first and second rows from the bottom are written by the defective beam 17, the third two pixels from the right in the third and fourth rows from the bottom can be written by the normal beam 18 instead of by the defective beam 17. Similarly, when the fourth pixel column from the right in the sub irradiation region 29 concerned is written, although the fourth two pixels from the right in the first and second rows from the bottom are written by the defective beam 25, the fourth two pixels from the right in the third and fourth rows from the bottom can be written by the normal beam 26 instead of by the defective beam 25. Thus, even when the beam swing back amount and the occurrence (generation) cycle of a plurality of defective beams are equivalent (consistent) to each other, being eight beam pitches, it is possible to reduce the number of pixels written by defective beams in the sub irradiation region 29. Specifically, since not all the sixteen pixels in the sub irradiation region 29 concerned are written by a defective beam and only the eight pixels indicated by oblique lines are written by the defective beam, the region written by the defective beam is reduced to half (½) of the sub irradiation region 29 concerned.

Figure 20:
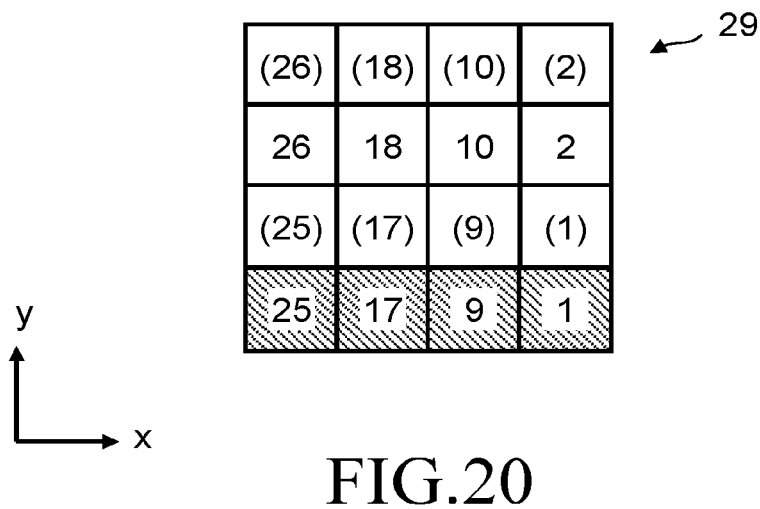
FIG. 20 illustrates another example of a writing situation of a sub irradiation region in the case of a beam swing back amount and an occurrence (generation) cycle of a plurality of defective beams being equivalent (consistent) to each other according to the third embodiment.

FIG. 20 illustrates another example of a writing situation of a sub irradiation region in the case of a beam swing back amount and an occurrence (generation) cycle of a plurality of defective beams being equivalent (consistent) to each other according to the third embodiment. FIG. 20 describes writing processing based on a writing sequence in which, when shift deflection is performed during tracking control, shifting is carried out by combining the case of shifting by the amount added by the size of the beam pitch P in the +y direction as an offset distance, and the case of shifting by the amount added by the size of the beam pitch P in the +x direction as an offset distance. Specifically, when performing shift deflection from the first shot to the second shot during each tracking control, shifting by the amount having been added by the size of the beam pitch P in the +y direction as an offset distance is carried out. When performing shift deflection from the second shot to the third shot during the same tracking control as that described above, shifting by the amount having been added by the size of the beam pitch P in the +x direction as an offset distance is carried out. When performing shift deflection from the third shot to the fourth shot during the same tracking control as that described above, shifting by the amounts having been added by the size of the beam pitch P in each of the +x direction and the +y direction as an offset distance is carried out.

When the first pixel column from the right in the sub irradiation region 29 concerned is written by the writing processing based on the writing sequence of FIG. 20, although the first pixel from the right in the first row from the bottom is written by the defective beam 1, the first pixel from the right in the second row from the bottom can be written not by the defective beam 1 but by the normal beam (1) which is lower than the defective beam 1 by one row. The first pixel from the right in the third row from the bottom can be written by the normal beam 2 instead of by the defective beam 1. The first pixel from the right in the fourth row from the bottom can be written not by the defective beam 1 but by the normal beam (2) which is lower than the normal beam 2 by one row.

Similarly, when the second pixel column from the right in the sub irradiation region 29 concerned is written, although the second pixel from the right in the first row from the bottom is written by the defective beam 9, the second pixel from the right in the second row from the bottom can be written not by the defective beam 9 but by the normal beam (9) which is lower than the defective beam 9 by one row. The second pixel from the right in the third row from the bottom can be written by the normal beam 10 instead of by the defective beam 9. The second pixel from the right in the fourth row from the bottom can be written not by the defective beam 9 but by the normal beam (10) which is lower than the normal beam 10 by one row.

When the third pixel column from the right in the sub irradiation region 29 concerned is written, although the third pixel from the right in the first row from the bottom is written by the defective beam 17, the third pixel from the right in the second row from the bottom can be written not by the defective beam 17 but by the normal beam (17) which is lower than the defective beam 17 by one row. The third pixel from the right in the third row from the bottom can be written by the normal beam 18 instead of by the defective beam 17. The third pixel from the right in the fourth row from the bottom can be written not by the defective beam 17 but by the normal beam (18) which is lower than the normal beam 18 by one row.

When the fourth pixel column from the right in the sub irradiation region 29 concerned is written, although the fourth pixel from the right in the first row from the bottom is written by the defective beam 25, the fourth pixel from the right in the second row from the bottom can be written not by the defective beam 25 but by the normal beam (25) which is lower than the defective beam 25 by one row. The fourth pixel from the right in the third row from the bottom can be written by the normal beam 26 instead of by the defective beam 25. The fourth pixel from the right in the fourth row from the bottom can be written not by the defective beam 25 but by the normal beam (26) which is lower than the normal beam 26 by one row. Thus, even when the beam swing back amount and the occurrence (generation) cycle of a plurality of defective beams are equivalent (consistent) to each other, being eight beam pitches, it is possible to reduce the number of pixels written by defective beams in the sub irradiation region 29. Specifically, since not all the sixteen pixels in the sub irradiation region 29 concerned are written by defective beams and only the four pixels indicated by oblique lines are written by the defective beams, the region written by the defective beam is reduced to one-fourth (¼) of the sub irradiation region 29 concerned.

Figure 21:
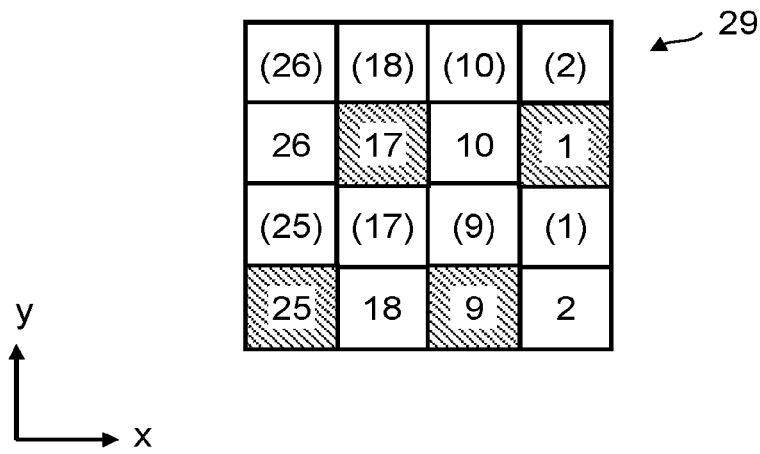
FIG. 21 illustrates another example of a writing situation of a sub irradiation region in the case of a beam swing back amount and an occurrence (generation) cycle of a plurality of defective beams being equivalent (consistent) to each other according to the third embodiment.

FIG. 21 illustrates another example of a writing situation of a sub irradiation region in the case of a beam swing back amount and an occurrence (generation) cycle of a plurality of defective beams being equivalent (consistent) to each other according to the third embodiment. FIG. 21 describes writing processing based on a writing sequence in which, when shift deflection is performed during tracking control, shifting is carried out by randomly changing the shift position and by combining the case of shifting by the amount added by the size of the beam pitch P in the +y direction as an offset distance, and the case of shifting by the amount added by the size of the beam pitch P in the +x direction as an offset distance.

In the example of FIG. 21, in the (k−1)th tracking reset, for performing shift deflection to the first shot to be executed during the k-th tracking control, shifting by the amount having been added by the size of the beam pitch P in the +x direction as an offset distance is carried out. When performing shift deflection from the first shot to the second shot during the same k-th tracking control, shifting by the amount having been added by the size of the beam pitch P in the +y direction as an offset distance is carried out. When performing shift deflection from the second shot to the third shot during the same k-th tracking control, there is no offset. When performing shift deflection from the third shot to the fourth shot during the same k-th tracking control, shifting by the amounts having been added by the size of the beam pitch P in each of the +x direction and the +y direction as an offset distance is carried out.

When performing shift deflection from the first shot to the second shot during the (k+1)th tracking control, shifting by the amount having been added by the size of the beam pitch P in the +y direction as an offset distance is carried out. When performing shift deflection from the second shot to the third shot during the same (k+1)th tracking control, shifting by the amount having been added by the size of the beam pitch P in the +x direction as an offset distance is carried out. When performing shift deflection from the third shot to the fourth shot during the same (k+1)th tracking control, shifting by the amounts having been added by the size of the beam pitch P in each of the +x direction and the +y direction as an offset distance is carried out.

In the (k+1)th tracking reset, for performing shift deflection to the first shot to be executed during the (k+2)th tracking control, shifting by the amount having been added by the size of the beam pitch P in the +x direction as an offset distance is carried out. When performing shift deflection from the first shot to the second shot during the same (k+2)th tracking control, shifting by the amount having been added by the size of the beam pitch P in the +y direction as an offset distance is carried out. When performing shift deflection from the second shot to the third shot during the same (k+2)th tracking control, there is no offset. When performing shift deflection from the third shot to the fourth shot during the same (k+2)th tracking control, shifting by the amounts having been added by the size of the beam pitch P in each of the +x direction and the +y direction as an offset distance is carried out.

When performing shift deflection from the first shot to the second shot during the (K+3)th tracking control, shifting by the amount having been added by the size of the beam pitch P in the +y direction as an offset distance is carried out. When performing shift deflection from the second shot to the third shot during the same (K+3)th tracking control, shifting by the amount having been added by the size of the beam pitch P in the +x direction as an offset distance is carried out. When performing shift deflection from the third shot to the fourth shot during the same (K+3)th tracking control, shifting by the amounts having been added by the size of the beam pitch P in each of the +x direction and the +y direction as an offset distance is carried out.

When the first pixel column from the right in the sub irradiation region 29 concerned is written by the writing processing based on the writing sequence of FIG. 21, the first pixel from the right in the first row from the bottom can be written by the normal beam 2 instead of by the defective beam 1. The first pixel from the right in the second row from the bottom can be written not by the defective beam 1 but by the normal beam (1) which is lower than the defective beam 1 by one row. The first pixel from the right in the third row from the bottom is written by the defective beam 1. The first pixel from the right in the fourth row from the bottom can be written not by the defective beam 1 but by the normal beam (2) which is lower than the normal beam 2 by one row.

When the second pixel column from the right in the sub irradiation region 29 concerned is written, although the second pixel from the right in the first row from the bottom is written by the defective beam 9, the second pixel from the right in the second row from the bottom can be written not by the defective beam 9 but by the normal beam (9) which is lower than the defective beam 9 by one row. The second pixel from the right in the third row from the bottom can be written by the normal beam 10 instead of by the defective beam 9. The second pixel from the right in the fourth row from the bottom can be written not by the defective beam 9 but by the normal beam (10) which is lower than the normal beam 10 by one row.

When the third pixel column from the right in the sub irradiation region 29 concerned is written, the third pixel from the right in the first row from the bottom can be written by the normal beam 18 instead of by the defective beam 17. The third pixel from the right in the second row from the bottom can be written not by the defective beam 17 but by the normal beam (17) which is lower than the defective beam 17 by one row. The third pixel from the right in the third row from the bottom is written by the defective beam 17. The third pixel from the right in the fourth row from the bottom can be written not by the defective beam 17 but by the normal beam (18) which is lower than the normal beam 18 by one row.

When the fourth pixel column from the right in the sub irradiation region 29 concerned is written, although the fourth pixel from the right in the first row from the bottom is written by the defective beam 25, the fourth pixel from the right in the second row from the bottom can be written not by the defective beam 25 but by the normal beam (25) which is lower than the defective beam 25 by one row. The fourth pixel from the right in the third row from the bottom can be written by the normal beam 26 instead of by the defective beam 25. The fourth pixel from the right in the fourth row from the bottom can be written not by the defective beam 25 but by the normal beam (26) which is lower than the normal beam 26 by one row. Thus, even when the beam swing back amount and the occurrence (generation) cycle of a plurality of defective beams are equivalent (consistent) to each other, being eight beam pitches, it is possible to reduce the number of pixels written by defective beams in the sub irradiation region 29. Specifically, since not all the sixteen pixels in the sub irradiation region 29 concerned are written by defective beams and only the four pixels indicated by oblique lines are written by the defective beams, the region written by the defective beam is reduced to one-fourth (¼) of the sub irradiation region 29 concerned. Furthermore, the pixels written by the defective beam can be away from each other.

Fourth Embodiment

A fourth embodiment describes a writing sequence of combination of the first to third embodiments. The configuration of the writing apparatus 100 in the fourth embodiment is the same as that of FIG. 1. Moreover, the flowchart of the writing method in the fourth embodiment is the same as that of FIG. 8. The contents of the fourth embodiment are the same as those of the first, second, or three embodiment except what is particularly described below.

Figure 22:
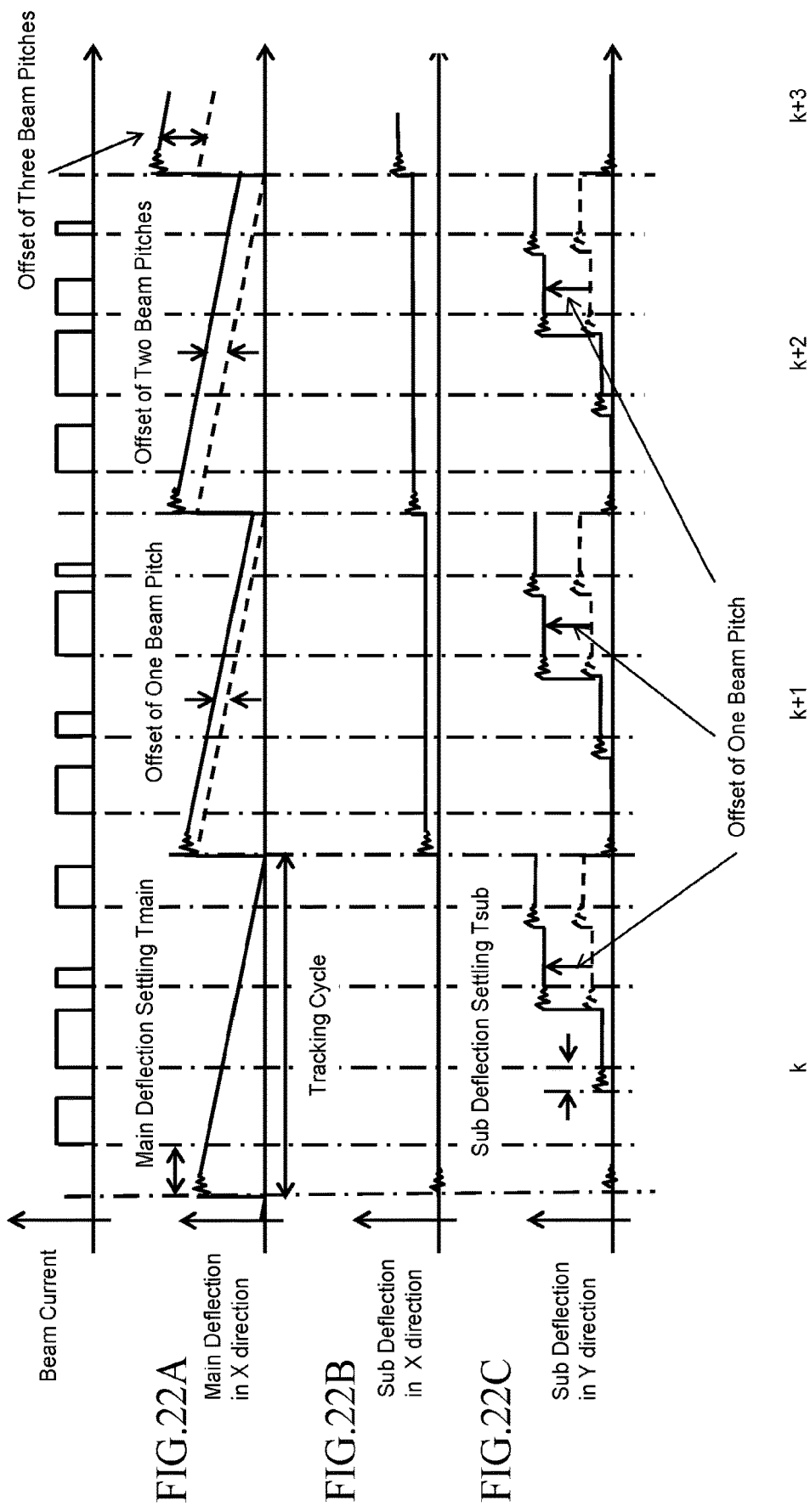
FIGS. 22A to 22C show examples of a relation between deflection voltage and time according to a fourth embodiment.

FIGS. 22A to 22C show examples of a relation between deflection voltage and time according to the fourth embodiment. In FIG. 22A, the ordinate axis represents deflection voltage Vtr output from the DAC amplifier (unit) 134 for tracking, and the abscissa axis represents time t. In FIG. 22B, the ordinate axis represents deflection voltage Vx in the x direction output from the DAC amplifier (unit) 132 for the sub deflector 209, and the abscissa axis represents time t. In FIG. 22C, the ordinate axis represents deflection voltage Vy in the y direction output from the DAC amplifier (unit) 132 for the sub deflector 209, and the abscissa axis represents time t. As shown in FIG. 22A, when performing the (k+1)th tracking control after the k-th tracking control by the main deflector 208, the voltage to which the offset voltage for one beam pitch has been added is applied in the x direction of main deflection. Then, when performing the (k+2)th tracking control, the voltage to which the offset voltage for two beam pitches has been added is applied in the x direction of main deflection. Then, when performing the (k+3)th tracking control, the voltage to which the offset voltage for three beam pitches has been added is applied in the x direction of main deflection. Thereby, the irradiation beam can be shifted by the beam deflection for tracking control by the main deflector 208. Further, during the k-th tracking control, when the writing position of the second shot shifts to the writing position of the third shot, as shown in FIG. 22C, the voltage for an offset of one beam pitch in the y direction of sub deflection is added. Similarly, during the (k+1)th tracking control, when the writing position of the second shot shifts to the writing position of the third shot, the voltage for an offset of one beam pitch in the y direction of sub deflection is added. Similarly, during the (k+2)th tracking control, when the writing position of the second shot shifts to the writing position of the third shot, the voltage for an offset of one beam pitch in the y direction of sub deflection is added. Similarly, during the (k+3)th tracking control, when the writing position of the second shot shifts to the writing position of the third shot, the voltage for an offset of one beam pitch in the y direction of sub deflection is added. Thereby, the irradiation beam can be shifted by beam deflection by the sub deflector 209. Thus, according to the fourth embodiment, beam shifting by offset by the main deflector 208 at the switching timing for each tracking control, and beam shifting by offset by sub deflector 209 during the tracking control period are both performed.

Figure 23:
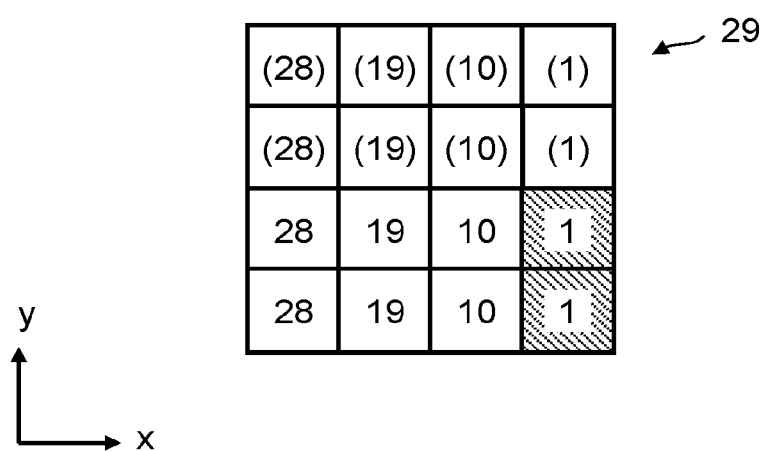
FIG. 23 illustrates an example of a writing situation of a sub irradiation region in the case of a beam swing back amount and an occurrence (generation) cycle of a plurality of defective beams being equivalent (consistent) to each other according to the fourth embodiment.

FIG. 23 illustrates an example of a writing situation of a sub irradiation region in the case of a beam swing back amount and an occurrence (generation) cycle of a plurality of defective beams being equivalent (consistent) to each other according to the fourth embodiment. In the example of FIG. 23, the writing processing is carried out based on a writing sequence in which, for each tracking control as shown in FIGS. 22A to 22C, swinging back whose amount has been added by the size of the beam pitch P in the +x direction as an offset distance is performed by the main deflector 208, and during each tracking control, shifting by the amount having been added by the size of the beam pitch P in the +y direction as an offset distance is performed by the sub deflector 209.

When the first pixel column from the right in the sub irradiation region 29 concerned is written by the writing processing based on the writing sequence of FIG. 23, although the first two pixels from the right in the first and second rows from the bottom are written by the defective beam 1, the first two pixels from the right in the third and fourth rows from the bottom can be written not by the defective beam 1 but by the normal beam (1) which is lower than the defective beam 1 by one row.

Similarly, when the second pixel column from the right in the sub irradiation region 29 concerned is written, the second two pixels from the right in the first and second rows from the bottom can be written by the normal beam 10 instead of by the defective beam 9. The second two pixels from the right in the third and fourth rows from the bottom can be written not by the defective beam 9 but by the normal beam (10) which is lower than the normal beam 10 by one row.

Similarly, when the third pixel column from the right in the sub irradiation region 29 concerned is written, the third two pixels from the right in the first and second rows from the bottom can be written by the normal beam 19 instead of by the defective beam 17. The third two pixels from the right in the third and fourth rows from the bottom can be written not by the defective beam 17 but by the normal beam (19) which is lower than the normal beam 19 by one row.

Similarly, when the fourth pixel column from the right in the sub irradiation region 29 concerned is written, the fourth two pixels from the right in the first and second rows from the bottom can be written by the normal beam 28 instead of by the defective beam 25. The fourth two pixels from the right in the third and fourth rows from the bottom can be written not by the defective beam 25 but by the normal beam (28) which is lower than the normal beam 28 by one row. Thus, even when the beam swing back amount and the occurrence (generation) cycle of a plurality of defective beams are equivalent (consistent) to each other, being eight beam pitches, it is possible to reduce the number of pixels written by defective beams in the sub irradiation region 29. Specifically, since not all the sixteen pixels in the sub irradiation region 29 concerned are written by defective beams and only the two pixels indicated by oblique lines are written by the defective beam, the region written by the defective beam is reduced to one-eighth (⅛) of the sub irradiation region 29 concerned.

Figure 24:
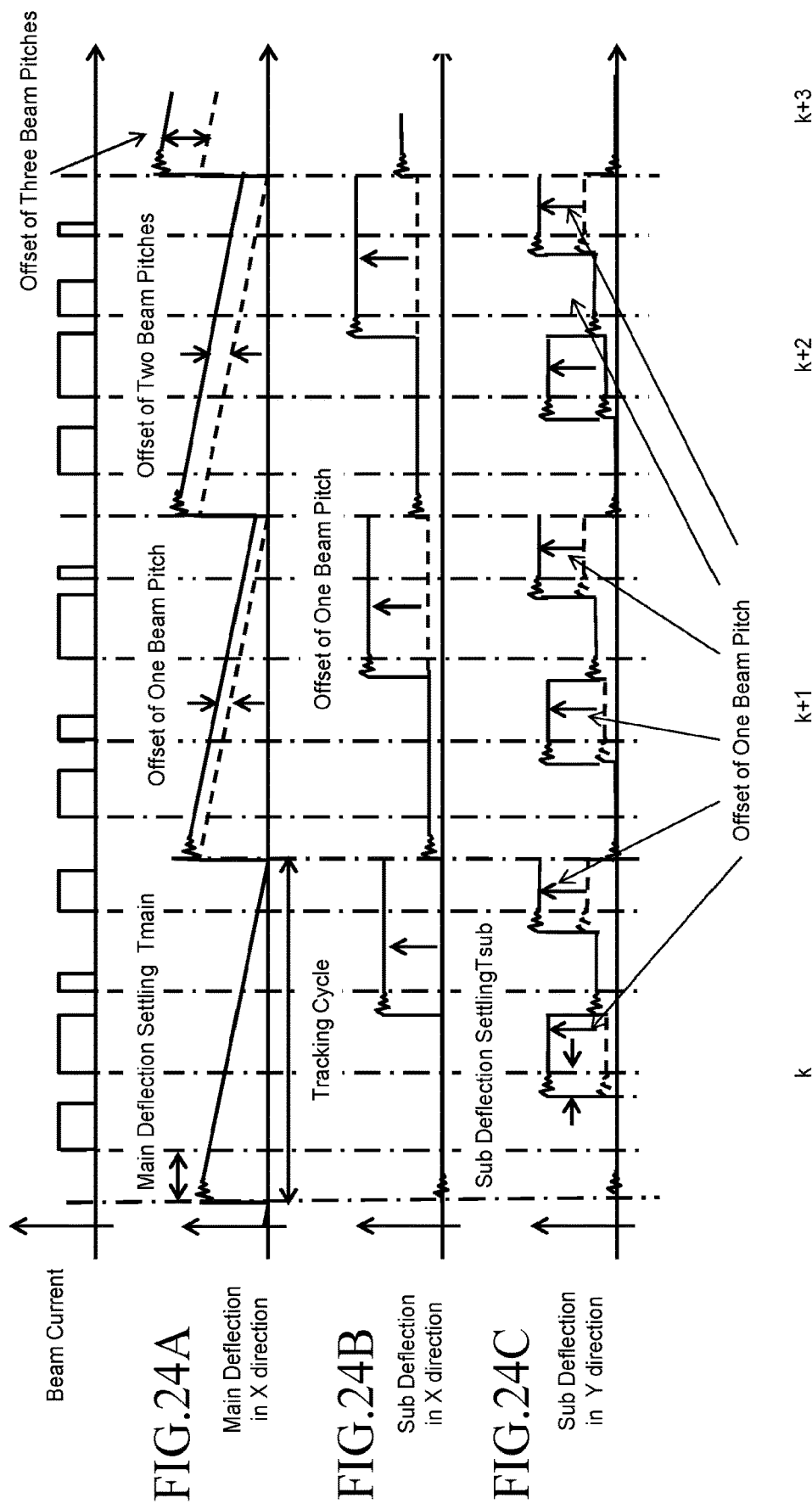
FIGS. 24A to 24C show examples of a relation between deflection voltage and time according to the fourth embodiment.

FIGS. 24A to 24C show examples of a relation between deflection voltage and time according to the fourth embodiment. In FIG. 24A, the ordinate axis represents deflection voltage Vtr output from the DAC amplifier (unit) 134 for tracking, and the abscissa axis represents time t. In FIG. 24B, the ordinate axis represents deflection voltage Vx in the x direction output from the DAC amplifier (unit) 132 for the sub deflector 209, and the abscissa axis represents time t. In FIG. 24C, the ordinate axis represents deflection voltage Vy in the y direction output from the DAC amplifier (unit) 132 for the sub deflector 209, and the abscissa axis represents time t. As shown in FIG. 24A, when performing the (k+1)th tracking control after the k-th tracking control by the main deflector 208, the voltage to which the offset voltage for one beam pitch has been added is applied in the x direction of main deflection. Then, when performing the (k+2)th tracking control, the voltage to which the offset voltage for two beam pitches has been added is applied in the x direction of main deflection. Then, when performing the (k+3)th tracking control, the voltage to which the offset voltage for three beam pitches has been added is applied in the x direction of main deflection. Thereby, the irradiation beam can be shifted by the beam deflection for tracking control by the main deflector 208. Further, during each tracking control, when the writing position of the first shot shifts to the writing position of the second shot, as shown in FIG. 24C, the voltage for an offset of one beam pitch in the y direction of sub deflection is added. Further, during each tracking control, when the writing position of the second shot shifts to the writing position of the third shot, as shown in FIG. 24B, the voltage for an offset of one beam pitch in the y direction of sub deflection is added. Further, during each tracking control, when the writing position of the third shot shifts to the writing position of the fourth shot, the voltage for an offset of one beam pitch in the y direction of sub deflection, and the voltage for an offset of one beam pitch in the x direction of sub deflection are added.

Figure 25:
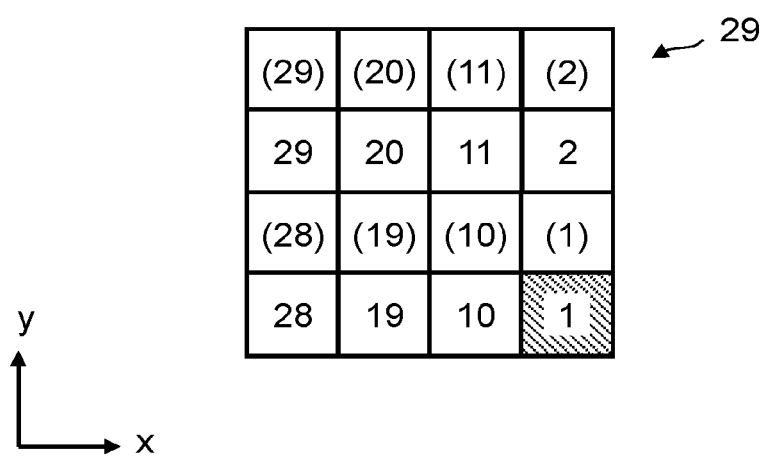
FIG. 25 illustrates another example of a writing situation of a sub irradiation region in the case of a beam swing back amount and an occurrence (generation) cycle of a plurality of defective beams being equivalent (consistent) to each other according to the fourth embodiment.

FIG. 25 illustrates another example of a writing situation of a sub irradiation region in the case of a beam swing back amount and an occurrence (generation) cycle of a plurality of defective beams being equivalent (consistent) to each other according to the fourth embodiment. In the example of FIG. 25, the writing processing is carried out based on a writing sequence in which, for each tracking control, swinging back whose amount has been added by the size of the beam pitch P in the +x direction as an offset distance is performed by the main deflector 208, and during each tracking control, shifting by the amount having been added by the size of the beam pitch P in the +x and/or +y direction as an offset distance is performed by the sub deflector 209.

When the first pixel column from the right in the sub irradiation region 29 concerned is written by the writing processing based on the writing sequence of FIG. 25, although the first pixel from the right in the first row from the bottom is written by the defective beam 1, the first pixel from the right in the second row from the bottom can be written not by the defective beam 1 but by the normal beam (1) which is lower than the defective beam 1 by one row. The first pixel from the right in the third row from the bottom can be written by the normal beam 2 instead of by the defective beam 1. The first pixel from the right in the fourth row from the bottom can be written not by the defective beam 1 but by the normal beam (2) which is lower than the normal beam 2 by one row.

Similarly, when the second pixel column from the right in the sub irradiation region 29 concerned is written, the second pixel from the right in the first row from the bottom can be written by the normal beam 10 instead of by the defective beam 9. The second pixel from the right in the second row from the bottom can be written not by the defective beam 9 but by the normal beam (10) which is lower than the normal beam 10 by one row. The second pixel from the right in the third row from the bottom can be written by the normal beam 11 instead of by the defective beam 9. The second pixel from the right in the fourth row from the bottom can be written not by the defective beam 9 but by the normal beam (11) which is lower than the normal beam 11 by one row.

Similarly, when the third pixel column from the right in the sub irradiation region 29 concerned is written, the third pixel from the right in the first row from the bottom can be written by the normal beam 19 instead of by the defective beam 17. The third pixel from the right in the second row from the bottom can be written not by the defective beam 17 but by the normal beam (19) which is lower than the normal beam 19 by one row. The third pixel from the right in the third row from the bottom can be written by the normal beam 20 instead of by the defective beam 17. The third pixel from the right in the fourth row from the bottom can be written not by the defective beam 17 but by the normal beam (20) which is lower than the normal beam 20 by one row.

Similarly, when the fourth pixel column from the right in the sub irradiation region 29 concerned is written, the fourth pixel from the right in the first row from the bottom can be written by the normal beam 28 instead of by the defective beam 25. The fourth pixel from the right in the second row from the bottom can be written not by the defective beam 25 but by the normal beam (28) which is lower than the normal beam 28 by one row. The fourth pixel from the right in the third row from the bottom can be written by the normal beam 29 instead of by the defective beam 25. The fourth pixel from the right in the fourth row from the bottom can be written not by the defective beam 25 but by the normal beam (29) which is lower than the normal beam 29 by one row. Thus, even when the beam swing back amount and the occurrence (generation) cycle of a plurality of defective beams are equivalent (consistent) to each other, being eight beam pitches, it is possible to reduce the number of pixels written by defective beams in the sub irradiation region 29. Specifically, since not all the sixteen pixels in the sub irradiation region 29 concerned are written by defective beams and only one pixel indicated by oblique lines is written by the defective beam, the region written by the defective beam is reduced to one-sixteenth (1/16) of the sub irradiation region 29 concerned.

Embodiments have been explained referring to specific examples described above. However, the present invention is not limited to these specific examples. With respect to the writing sequence of any of the second to fourth embodiments, it is preferable to previously prepare a plurality of writing sequences in which the offset distance (offset amount) and direction are variable. Information on a plurality of writing sequences 1, 2, 3, 4, and so on including a plurality of writing sequences prepared as described above is input to the writing apparatus 100 from the outside, and stored in the storage device 144. The maximum. number of defective pixels calculation step (S104) and the writing sequence selection step (S108) are carried out to select a writing sequence in which the maximum number of defective pixels is smaller than others in a plurality of writing sequences. Moreover, in the examples described above, although a two-stage deflection by the main deflector 208 and the sub deflector 209 is performed, it is not limited thereto. A single-stage deflection (performing both of tracking and pixel switching) may be carried out. The blanking mechanism for multiple charged particle beams is not limited to the blanking aperture array. For example, blanking control may be performed by an aperture array using a mechanical shutter. Not a device which performs blanking control by a blanking aperture but a multi-laser beam writing apparatus which performs blanking of a laser by a digital mirror device (DMD) and the like may be used.

While the apparatus configuration, control method, and the like not directly necessary for explaining the present invention are not described, some or all of them can be appropriately selected and used on a case-by-case basis when needed. For example, although description of the configuration of the control unit for controlling the writing apparatus 100 is omitted, it should be understood that some or all of the configuration of the control unit can be selected and used appropriately when necessary.

In addition, any other multiple charged particle beam writing method and multiple charged particle beam writing apparatus that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-beam writing method comprising:
    performing a k-th tracking control (k being a natural number) by beam deflection in order to follow movement of a stage while collecting each beam of multiple beams;
    performing a plurality of shots of the multiple beams by the each beam simultaneously shifting in a rectangular or square irradiation region, which is surrounded by a size of a beam pitch and corresponding to the each beam, while performing the k-th tracking control; and
    returning, after a period of the k-th tracking control has passed, a tracking position to a position which is obtained by adding an offset of an integer multiple of the size of the beam pitch to a tracking starting position of the k-th tracking control where the k-th tracking control started, to be as a starting position of a (k+1)th tracking control.

2. The method according to claim 1, wherein a deflector is used for the beam deflection for tracking control,
    further comprising:
    collectively deflecting, during the tracking control, the multiple beams to a position to which a writing position of the each beam is offset by an offset distance of an integer multiple of the size of the beam pitch, using another deflector different from the deflector used for the beam deflection for the tracking control.

3. The method according to claim 1, further comprising:
    selecting an offset distance to be used for the tracking starting position of the (k+1)th tracking control from a plurality of preset distances for the offset.

4. The method according to claim 1, further comprising:
    detecting a defective beam in the multiple beams,
    wherein the tracking position is returned, by the beam deflection for tracking control, to the position which is obtained by adding the offset of the integer multiple of the size of the beam pitch to the tracking starting position of the k-th tracking control where the k-th tracking control started after the detecting the defective beam, to be as the starting position of the (k+1)th tracking control after the detecting the defective beam.

5. The method according to claim 2, wherein the offset during the tracking control is performed perpendicularly to a direction of the tracking control.

6. The method according to claim 2, wherein the offset during the tracking control is performed in parallel to a direction of the tracking control.

7. The method according to claim 2, wherein the offset during the tracking control is performed both in perpendicular and parallel to a direction of the tracking control.

8. A multi-beam writing method comprising:
    performing a tracking control by beam deflection using a deflector in order to follow movement of a stage while collecting each beam of multiple beams;
    performing a plurality of shots of the multiple beams by the each beam simultaneously shifting in a rectangular or square irradiation region, which is surrounded by a size of a beam pitch and corresponding to the each beam, while performing the tracking control; and
    collectively deflecting, during the tracking control, the multiple beams to a position to which a writing position of the each beam is offset by an offset distance of an integer multiple of the size of the beam pitch, using another deflector different from the deflector used for beam deflection for the tracking control.

9. The method according to claim 8, wherein the offset during the tracking control is performed perpendicularly to a direction of the tracking control.

10. The method according to claim 8, wherein the offset during the tracking control is performed in parallel to a direction of the tracking control.

11. A multi-beam writing apparatus comprising:
    a stage configured to mount a target object thereon and be able to move continuously;
    a multi-beam emission source configured to emit multiple beams;
    an irradiation time control circuit configured to control an irradiation time of each beam of the multiple beams;
    a first deflector configured to deflect the multiple beams to perform a k-th tracking control (k being a natural number) in order to follow movement of the stage while collecting the each beam of the multiple beams;

a second deflector configured to deflect the multiple beams to perform a plurality of shots of the multiple beams by the each beam simultaneously shifting in a rectangular or square irradiation region, which is surrounded by a size of a beam pitch and corresponding to the each beam, during a tracking control period of each tracking control; and a deflection control circuit configured to control the first deflector, after a period of the k-th tracking control has passed, to return a tracking position to a position which is obtained by adding an offset of an integer multiple of the size of the beam pitch to a tracking starting position of the k-th tracking control where the k-th tracking control started, to be as a starting position of a (k+1)th tracking control.

* * * * *